United States Patent
Yoo et al.

(10) Patent No.: US 9,536,897 B2
(45) Date of Patent: Jan. 3, 2017

(54) SEMICONDUCTOR DEVICE AND METHOD OF FABRICATING THE SAME

(71) Applicants: Dongchul Yoo, Seongnam-si (KR); Chaeho Kim, Gwangmyeong-si (KR); Jaeyoung Ahn, Seongnam-si (KR); Woong Lee, Seoul (KR)

(72) Inventors: Dongchul Yoo, Seongnam-si (KR); Chaeho Kim, Gwangmyeong-si (KR); Jaeyoung Ahn, Seongnam-si (KR); Woong Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/695,249

(22) Filed: Apr. 24, 2015

(65) Prior Publication Data
US 2016/0049423 A1 Feb. 18, 2016

(30) Foreign Application Priority Data
Aug. 12, 2014 (KR) .................. 10-2014-0104417

(51) Int. Cl.
*H01L 27/115* (2006.01)
(52) U.S. Cl.
CPC ..... *H01L 27/11582* (2013.01); *H01L 27/1157* (2013.01); *H01L 27/11565* (2013.01); *H01L 27/11573* (2013.01); *H01L 27/11575* (2013.01)
(58) Field of Classification Search
None
See application file for complete search history.

(56) References Cited

U.S. PATENT DOCUMENTS

| | | | |
|---|---|---|---|
| 8,344,385 B2 | 1/2013 | Kim et al. | |
| 8,492,824 B2 | 7/2013 | Yahashi | |
| 8,541,831 B2 | 9/2013 | Chae et al. | |
| 2009/0267135 A1* | 10/2009 | Tanaka | H01L 27/115 257/324 |
| 2010/0133599 A1 | 6/2010 | Chae et al. | |
| 2011/0073866 A1 | 3/2011 | Kim et al. | |
| 2011/0121403 A1* | 5/2011 | Lee | H01L 27/11526 257/390 |
| 2011/0151667 A1* | 6/2011 | Hwang | H01L 27/11551 438/667 |
| 2011/0316064 A1* | 12/2011 | Kim | H01L 27/11582 257/314 |

(Continued)

FOREIGN PATENT DOCUMENTS

| KR | 10-2011-0015337 A | 2/2011 |
|---|---|---|
| KR | 1020130086778 A | 8/2013 |
| KR | 1020130097562 A | 9/2013 |

*Primary Examiner* — Khaja Ahmad
(74) *Attorney, Agent, or Firm* — Harness, Dickey & Pierce, P.L.C.

(57) ABSTRACT

A three-dimensional semiconductor device may include a substrate including a cell array region, a word line contact region, and a peripheral circuit region, gate electrodes stacked on the substrate to extend from the cell array region to the word line contact region, a channel hole penetrating the gate electrodes on the cell array region and exposing an active region of the substrate, a dummy hole penetrating the gate electrodes on the word line contact region and exposing a device isolation layer provided on the substrate, and a semiconductor pattern provided in the channel hole but not in the dummy hole.

19 Claims, 29 Drawing Sheets

(56) References Cited

U.S. PATENT DOCUMENTS

| | | | |
|---|---|---|---|
| 2012/0003831 A1* | 1/2012 | Kang | H01L 27/11551 |
| | | | 438/639 |
| 2012/0168858 A1 | 7/2012 | Hong | |
| 2012/0211816 A1 | 8/2012 | Yahashi | |
| 2013/0099306 A1 | 4/2013 | Choi et al. | |
| 2013/0109158 A1* | 5/2013 | Lee | H01L 27/11582 |
| | | | 438/488 |
| 2013/0126959 A1 | 5/2013 | Aburada et al. | |

* cited by examiner

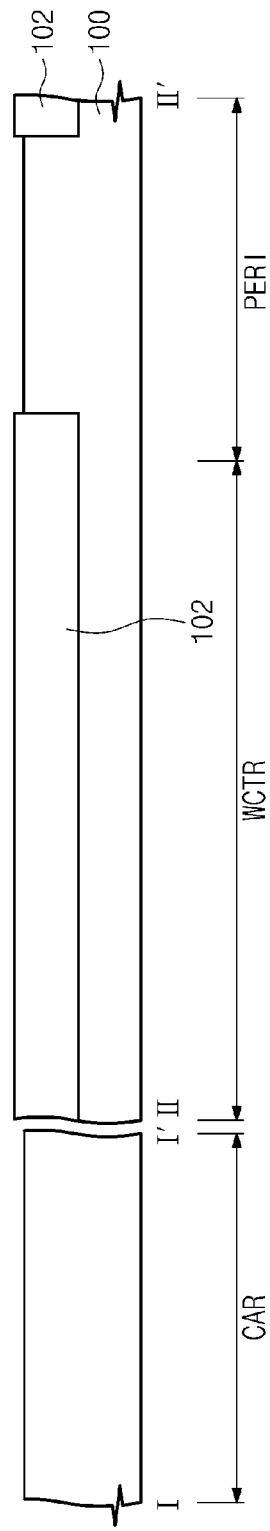
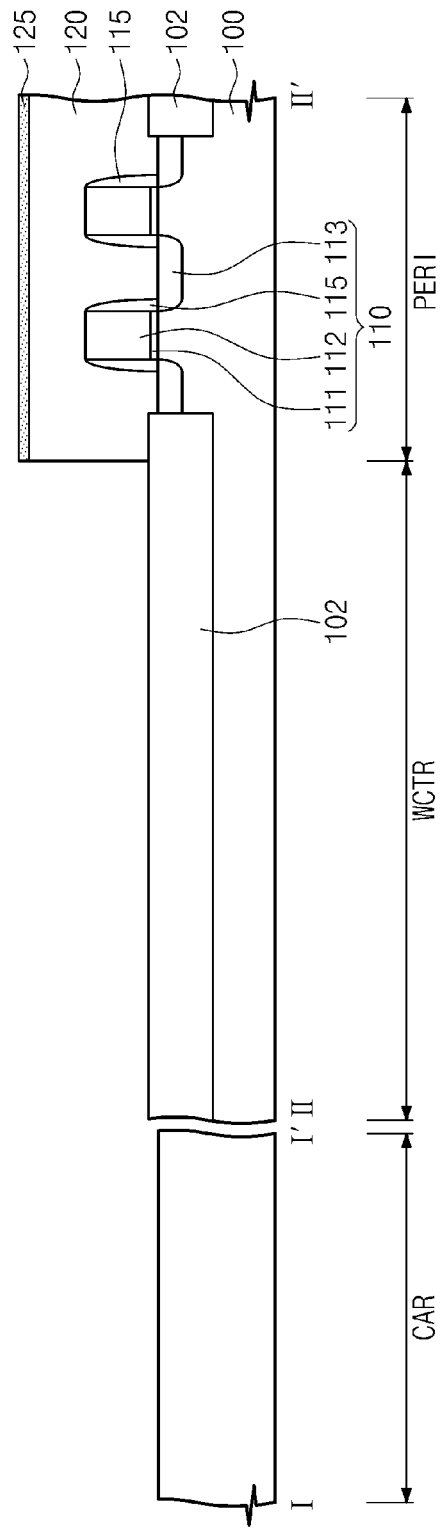

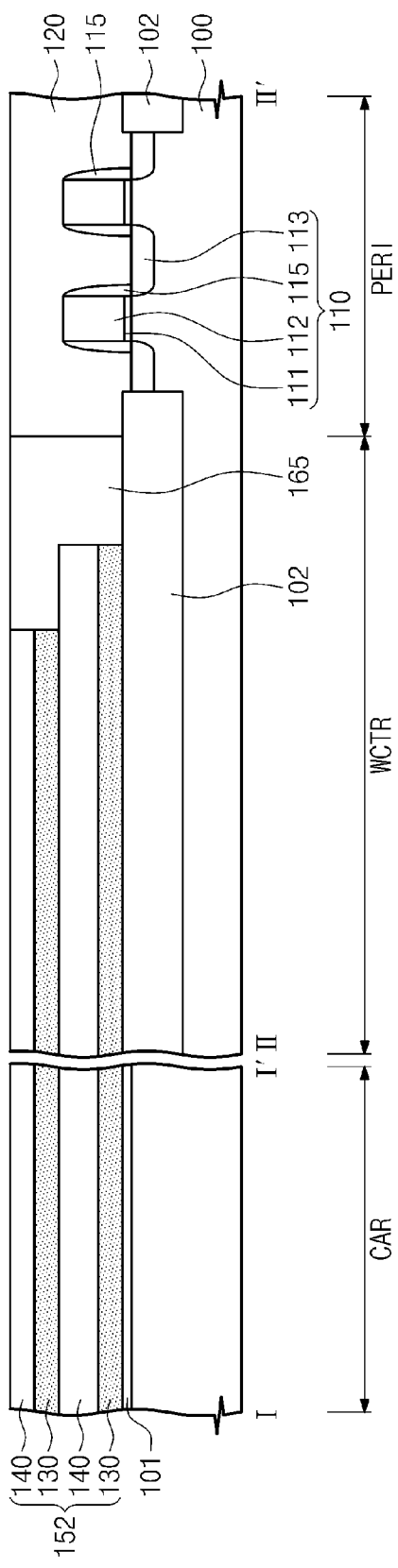

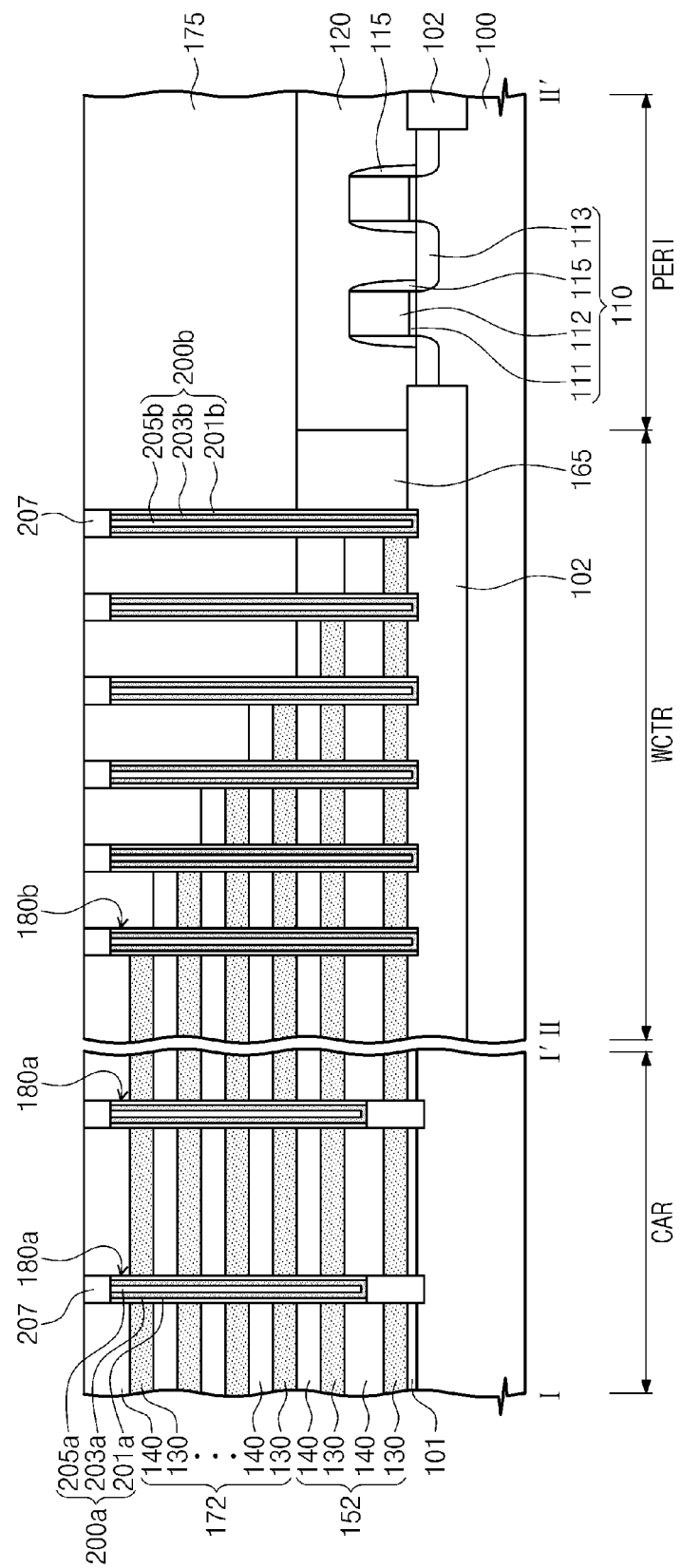

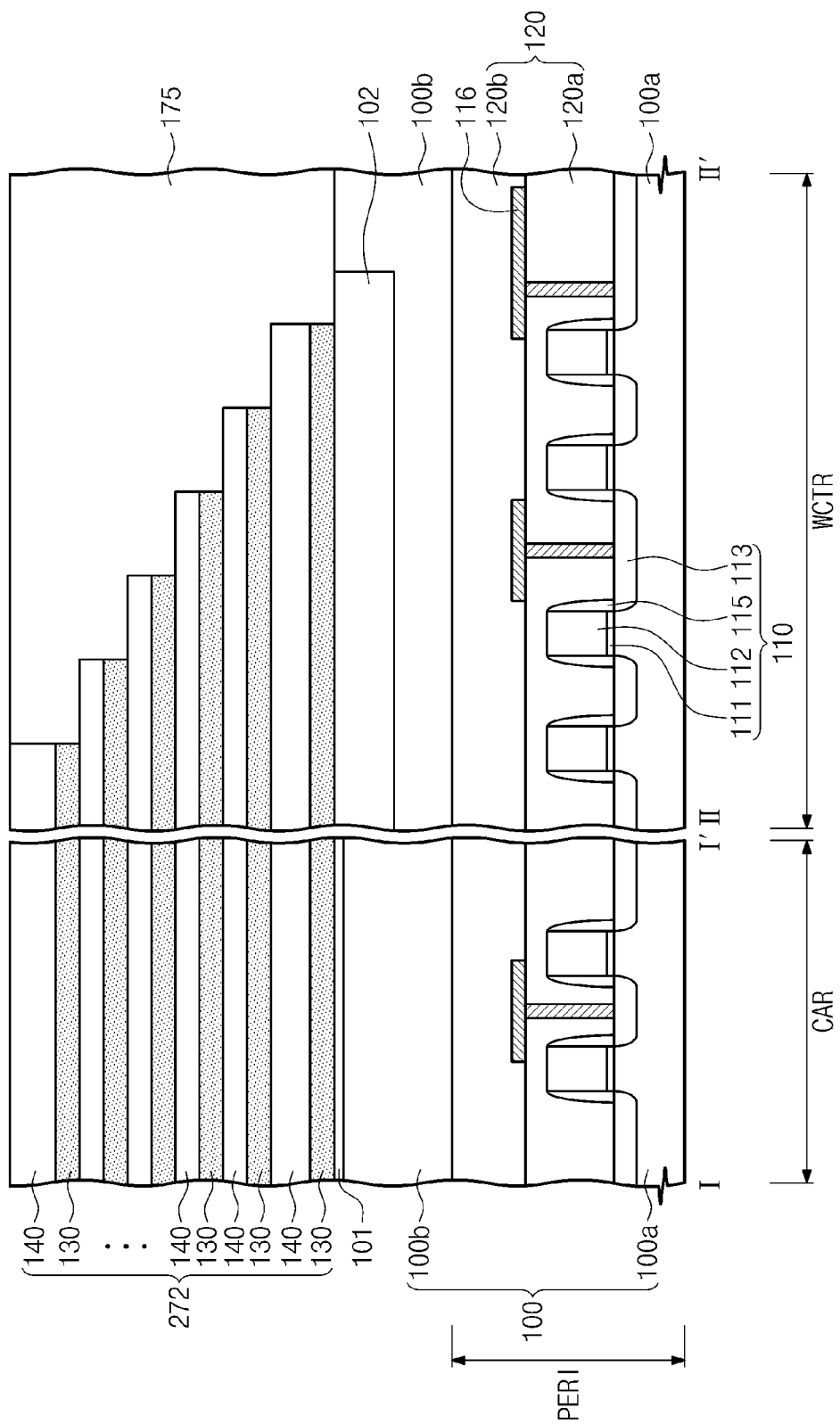

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0104417, filed on Aug. 12, 2014, in the Korean Intellectual Property Office, the entire contents of which are hereby incorporated by reference.

BACKGROUND OF THE INVENTION

Example embodiments of the inventive concepts relate to a semiconductor device and a method of fabricating the same, and in particular, to a three-dimensional semiconductor device and a method of fabricating the same.

The continued development of highly integrated semiconductor devices is spurred in part by consumer demand for low-cost, superior performance products. Indeed, particularly in the case of semiconductor devices, increased device integration is a major factor in achieving price points satisfying market demands. Conventionally, semiconductor memory devices include planar or two-dimensional (2D) memory cell arrays, i.e., memory cell arrays having memory cells laid-out in a two-dimensional plane. Further integration of such devices is becoming more difficult (and costly) as patterning technologies approach practical limits. At the very least, prohibitively expensive process equipment would be needed to achieve major advances in 2D memory cell array device integration.

As a result, three-dimensional (3D) semiconductor devices have been proposed in which the memory cells of the memory cell array are arranged in three dimensions. However, there are significant manufacturing obstacles in achieving low-cost, mass-production of 3D semiconductor devices, particularly in the mass-fabrication of 3D devices that maintain or exceed the operational reliability of their 2D counterparts.

SUMMARY

Example embodiments of the inventive concepts provide a three-dimensional semiconductor device configured to increase an integration density thereof and a method of fabricating the same.

According to example embodiments of the inventive concept, a three-dimensional semiconductor device may include a substrate including a cell array region, a word line contact region, and a peripheral circuit region, gate electrodes stacked on the substrate to extend from the cell array region to the word line contact region, a vertical channel structure penetrating the gate electrodes on the cell array region and being electrically connected to the substrate, a semiconductor pattern disposed between the vertical channel structure and the substrate, and a dummy pillar penetrating the gate electrodes on the word line contact region and being electrically separated from the substrate. The dummy pillar may be provided to penetrate a lowermost one of the gate electrodes.

In example embodiments, the substrate may include a first substrate and a second substrate, and the first substrate may be disposed below the second substrate.

In example embodiments, the first substrate may include the peripheral circuit region, and the second substrate may include the cell array region and the word line contact region.

In example embodiments, the peripheral circuit region may include a horizontal transistor.

In example embodiments, horizontal lengths of the gate electrodes may decrease with increasing distance from the substrate.

In example embodiments, the vertical channel structure may include a first gate dielectric pattern, a first vertical channel pattern, and a first insulating gap-fill pattern.

In example embodiments, the first gate dielectric pattern may have a pipe-shaped structure.

In example embodiments, the first gate dielectric pattern may include a charge blocking layer, a charge storing layer, and a tunnel insulating layer.

In example embodiments, the first vertical channel pattern may have a hollow cylindrical shape or a cup shape.

In example embodiments, the first vertical channel pattern may be in direct contact with the semiconductor pattern.

In example embodiments, the dummy pillar may be in contact with a device isolation layer provided on the word line contact region.

In example embodiments, the dummy pillar may include a second gate dielectric pattern, a second vertical channel pattern, and a second insulating gap-fill pattern.

In example embodiments, the vertical channel structure may have a bottom surface positioned at a higher level than a bottom surface of the dummy pillar.

In example embodiments, the semiconductor pattern may penetrate the lowermost one of the gate electrodes and may be in contact with the substrate.

In example embodiments, the device may further include interconnection plugs electrically connected to the gate electrodes.

In example embodiments, the interconnection plugs may have different vertical lengths from each other.

According to example embodiments of the inventive concept, a three-dimensional semiconductor device may include a substrate including a cell array region, a word line contact region, and a peripheral circuit region, gate electrodes stacked on the substrate to extend from the cell array region to the word line contact region, a channel hole penetrating the gate electrodes on the cell array region and exposing an active region of the substrate, a dummy hole penetrating the gate electrodes on the word line contact region and exposing a device isolation layer provided on the substrate, and a semiconductor pattern provided in the channel hole but not in the dummy hole.

In example embodiments, the substrate may include a first substrate and a second substrate, and the first substrate may be provided below the second substrate.

In example embodiments, the first substrate may include the peripheral circuit region, and the second substrate may include the cell array region and the word line contact region.

According to example embodiments of the inventive concept, A three-dimensional semiconductor device may include a substrate including a cell array region and a word line contact region: gate electrodes stacked on the substrate to extend from the cell array region to the word line contact region, a channel hole penetrating the gate electrodes on the cell array region and exposing an active region of the substrate, a dummy hole penetrating the gate electrodes on the word line contact region and exposing a device isolation layer provided on the substrate, a semiconductor pattern and a vertical channel structure provided in the channel hole, and a dummy pillar provided in the dummy hole. The dummy pillar may have a bottom surface positioned at a lower level than a bottom surface of the vertical channel structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A through 6E are sectional views taken along lines I-I' and II-IP of FIG. 3B to illustrate a method of fabricating a semiconductor device according to other example embodiments of the inventive concept.

Figure 1:
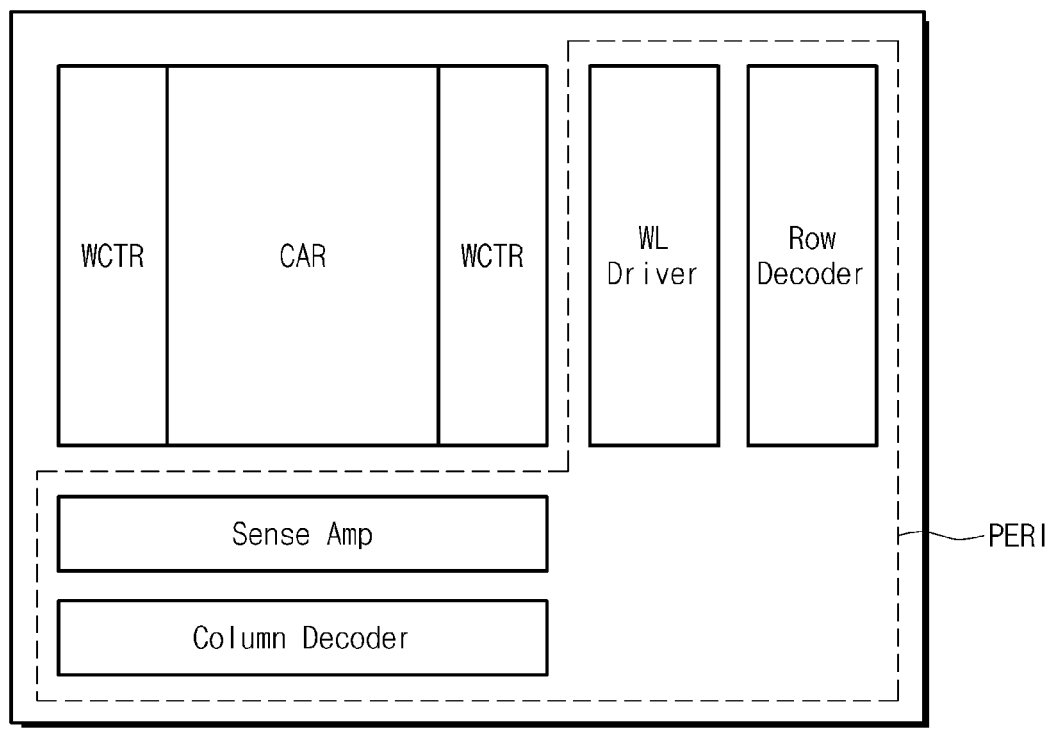
FIG. 1 is a schematic block diagram illustrating a three-dimensional semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a three-dimensional semiconductor device according to example embodiments of the inventive concept.

Referring to FIG. 1, the semiconductor device according to some embodiments of the inventive concepts may include a cell array region CAR, a word line contact region WCTR and a peripheral circuit region PERI. The cell array region CAR may include memory cells three-dimensionally disposed, and bit lines and word lines electrically coupled to the memory cells. The word line contact region WCTR may be disposed between the cell array region CAR and the peripheral circuit region PERI, and interconnection plugs and metal lines may be disposed in the word line contact region WCTR to connect the memory cells with peripheral circuits. The peripheral circuits, which are configured to drive the memory cells or read data stored in the memory cells, may be formed in the peripheral circuit region PERI. For example, the peripheral circuits may include word line drivers, sense amplifiers, row and column decoders, and control circuits.

Figure 2:
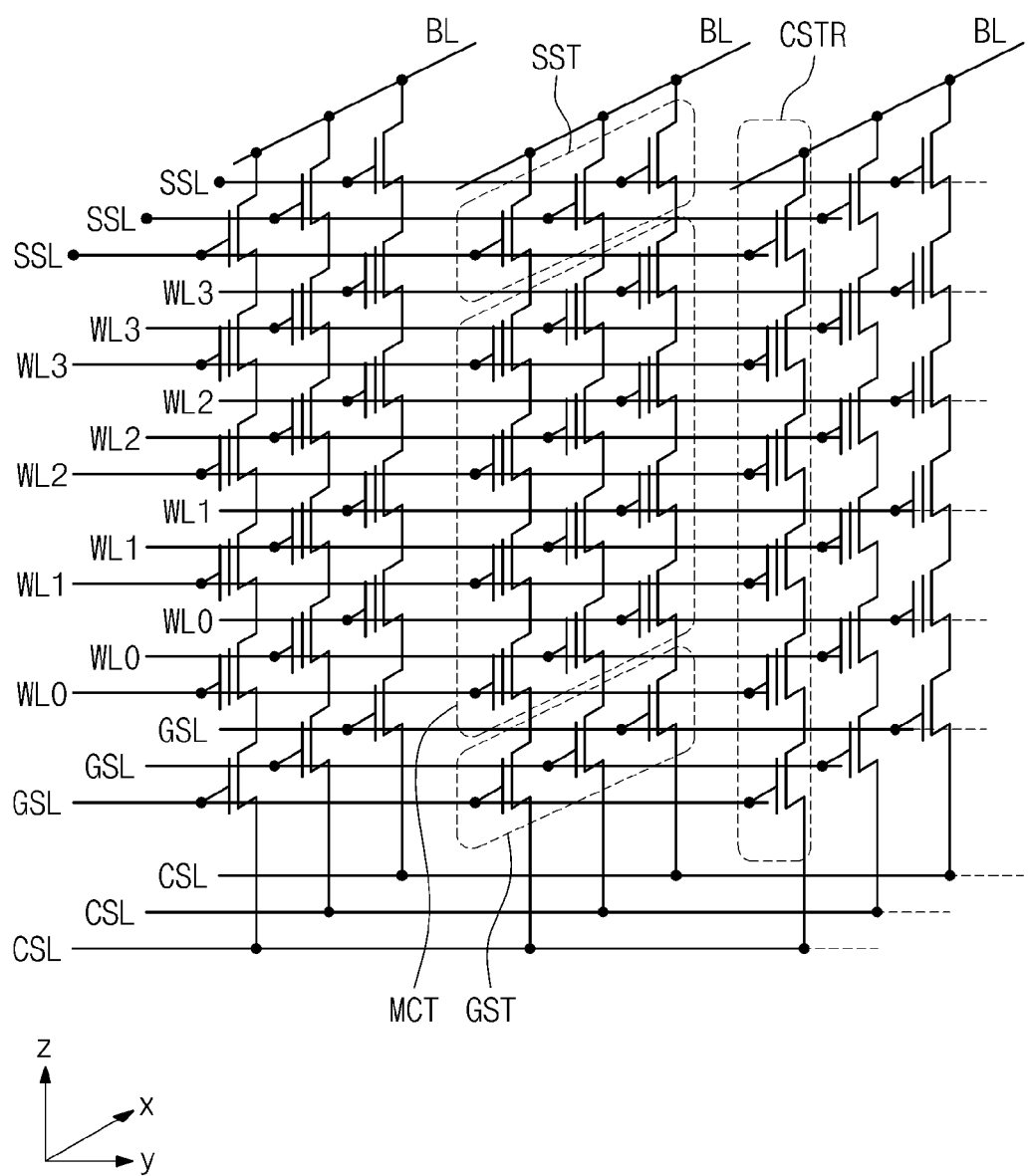
FIG. 2 is a schematic circuit diagram illustrating a cell array of a three-dimensional semiconductor device according to example embodiments of the inventive concept.

FIG. 2 is a schematic circuit diagram of a cell array of a three-dimensional semiconductor device according to example embodiments of the inventive concept.

Referring to FIG. 2, the cell array CAR of the three-dimensional semiconductor device may include at least one common source line CSL, a plurality of bit lines BL, and a plurality of cell strings CSTR interposed between the common source line CSL and the bit lines BL.

The bit lines BL may be two-dimensionally arranged and a plurality of the cell strings CSTR may be connected in parallel to each of the bit lines BL. The cell strings CSTR may be connected in common to the common source line CSL. That is, the plurality of the cell strings CSTR may be disposed between each of the bit lines BL and the common source line CSL. In example embodiments, the cell array region CAR may include a plurality of common source lines CSL two-dimensionally arranged. Here, the common source lines CSL may be connected with one another to be in an equipotential state. Alternatively, the common source lines CSL may be separated from one another such that they are controlled independently.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. Here, the ground selection transistor GST, the memory cell transistors MCT, and the string selection transistor SST may be connected in series.

Sources regions of the ground selection transistors GST may be connected in common to the common source line CSL. In addition, at least one ground selection line GSL, a plurality of word lines WL0 to WL3, and a plurality of string selection lines SSL may be disposed between the common source line CSL and the bit lines BL to serve as gate electrodes of the ground selection transistor GST, the memory cell transistors MCT and the string selection transistors SST, respectively. Moreover, each of the memory cell transistors MCT may include a data storage element.

Figure 3A:
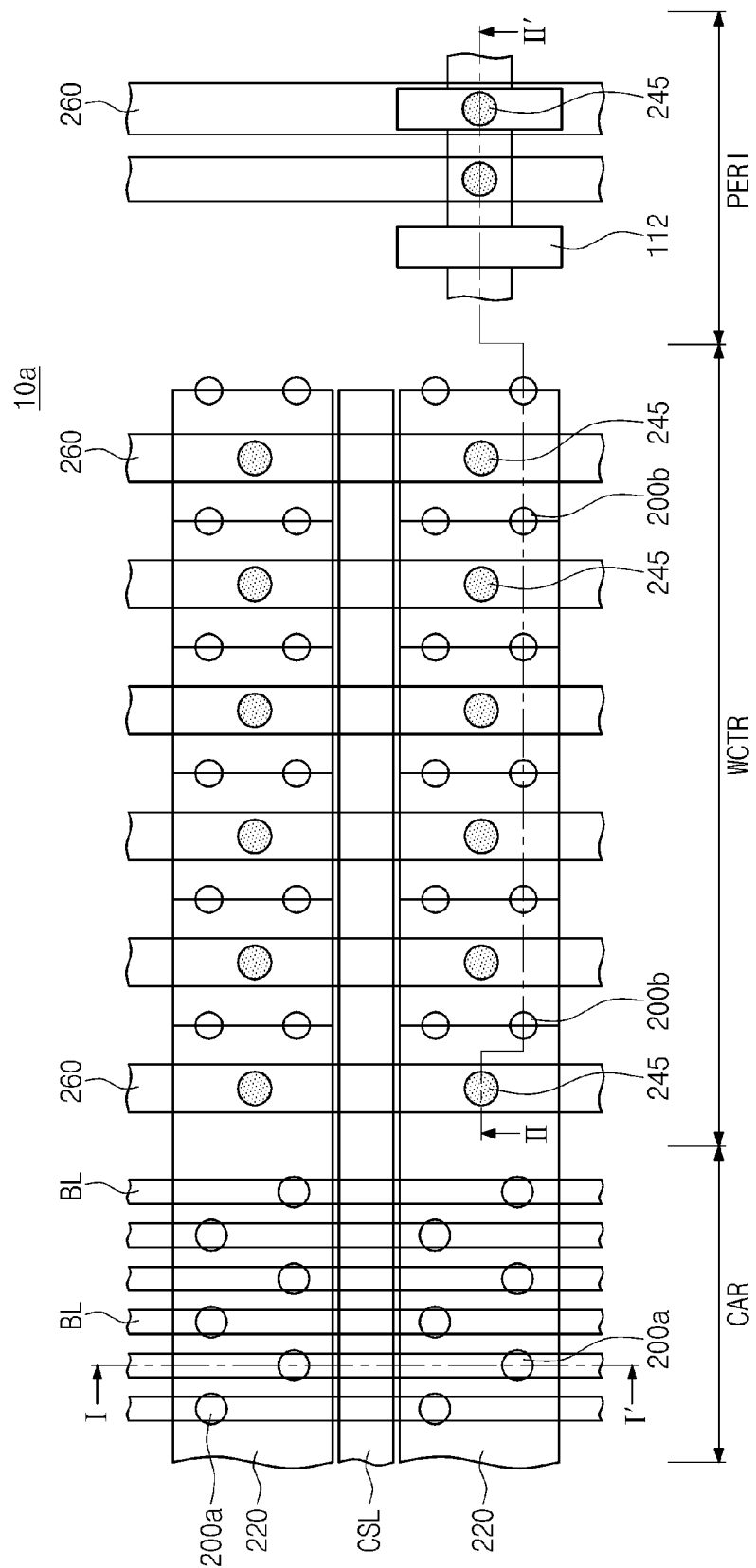
FIGS. 3A and 3B are plan views of three-dimensional semiconductor devices according to example embodiments of the inventive concept.
Figure 3B:
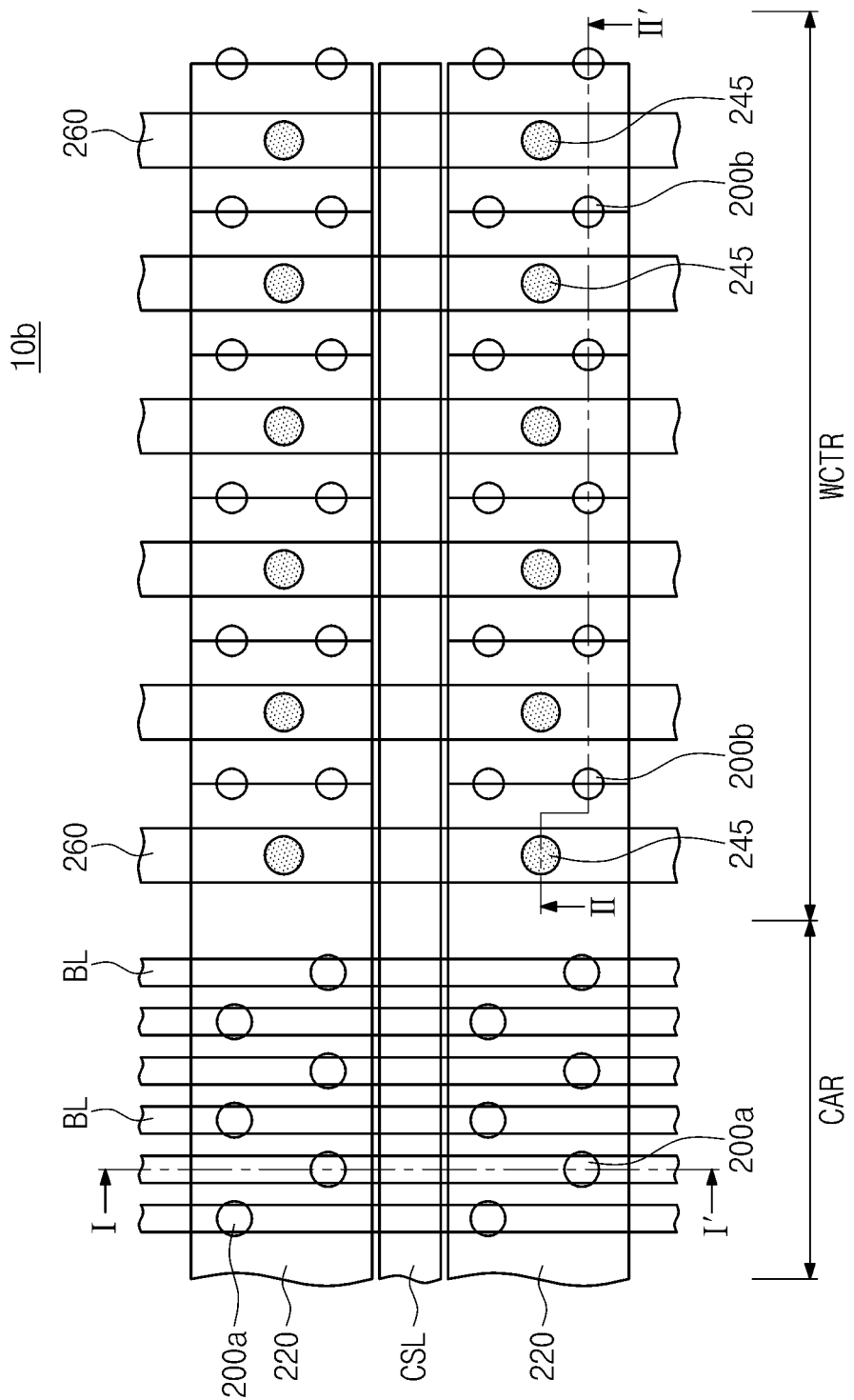
Figure 4A:
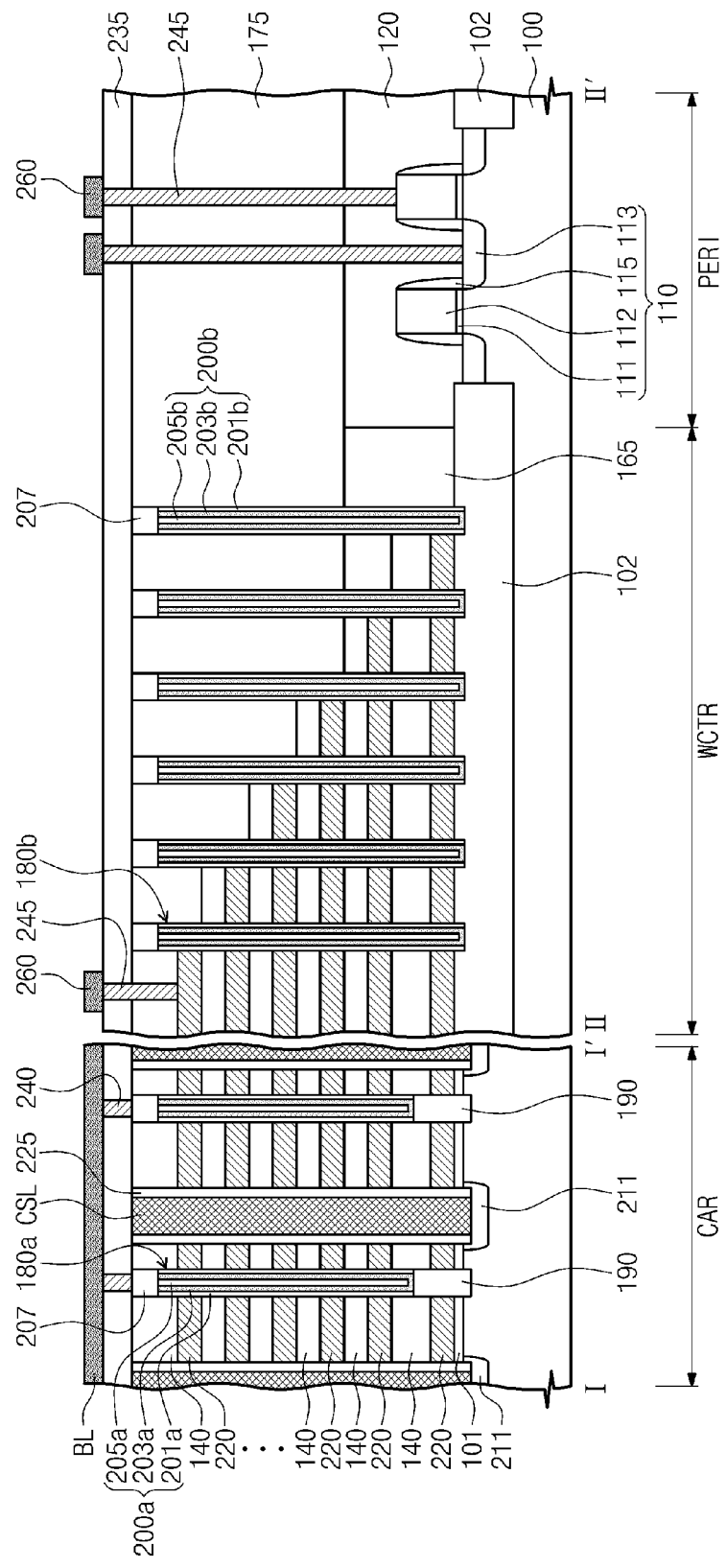
FIGS. 4A and 4B are sectional views taken along lines I-I' and II-II' of FIGS. 3A and 3B, respectively, to illustrate semiconductor devices according to example embodiments of the inventive concept.
Figure 4B:
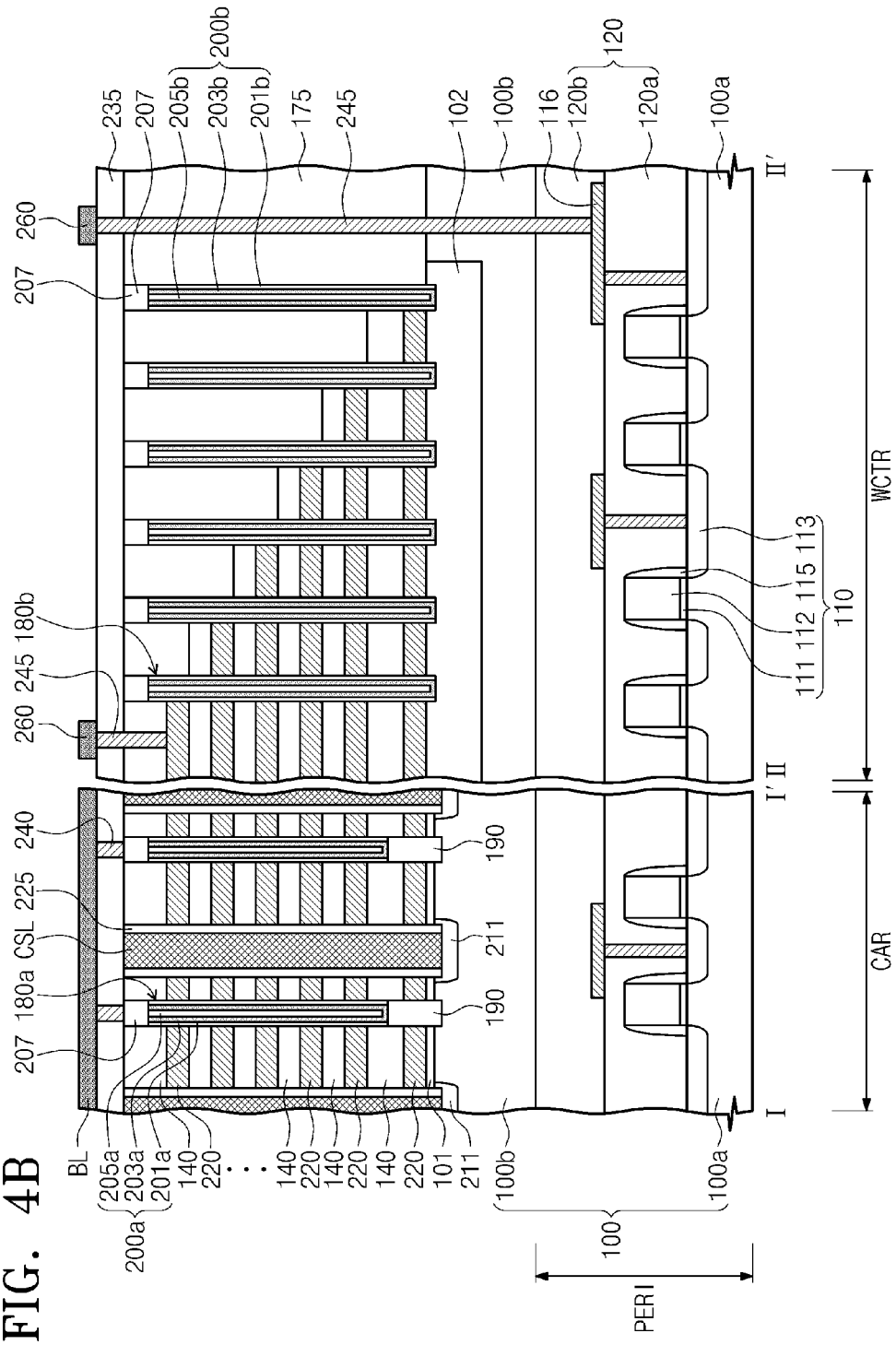

FIGS. 3A and 3B are plan views of three-dimensional semiconductor devices according to example embodiments of the inventive concept, and FIGS. 4A and 4B are sectional views taken along lines I-I' and II-II' of FIGS. 3A and 3B, respectively.

Referring to FIGS. 3A and 4A, a three-dimensional semiconductor device 10a may include a cell array region CAR, a word line contact region WCTR, and a peripheral circuit region PERI. Gate electrodes 220, vertical channel structures 200a, common source lines CSL, and bit lines BL may be provided on the cell array region CAR. Dummy pillars 200b, interconnection plugs 245, and metal lines 260 may be provided on the word line contact region WCTR. Horizontal transistors 110, the interconnection plugs 245, and the metal lines 260 may be provided on the peripheral circuit region PERI.

A device isolation layer 102 may be provided on a substrate 100 to define active regions. The substrate 100 may be formed of or include a material exhibiting a semiconductor property. For example, the substrate 100 may be provided in the form of a silicon wafer.

The gate electrodes 220 and interlayered insulating layers 140 may be provided to surround sidewalls of the vertical channel structures 200a and extend from the cell array region CAR to the word line contact region WCTR. On the word line contact region WCTR, the gate electrodes 220 may be formed to form a stepwise shape. For example, the gate electrodes 220 may have different horizontal lengths. The horizontal lengths of the gate electrodes 220 may decrease in a direction away from the substrate 100. In other words, the lowermost one of the gate electrodes 220 may have the longest horizontal length, and the uppermost one of the gate electrodes 220 may have the shortest horizontal length. The gate electrodes 220 may be electrically separated from each other by the interlayered insulating layers 140. The gate electrodes 220 may include at least one ground selection gate electrode, a plurality of memory cell gate electrodes, and at least one string selection gate electrode. In certain embodiments, the ground selection gate electrode may be the lowermost one of the gate electrodes 220, and the string selection gate electrode may be the uppermost one of the gate electrodes 220. The memory cell gate electrodes may be stacked between the ground and string selection gate electrodes. The memory cell gate electrodes may be formed to have substantially the same thickness. In certain embodiments, thicknesses of the ground and string selection gate electrodes may be different from that of the memory cell gate electrodes. For example, the ground and string selection gate electrodes may be thicker than the memory cell gate electrodes. In example embodiments, the memory cell gate electrodes may serve as word lines. The ground selection gate electrode may serve as a ground selection line, and the string selection gate electrode may serve as a string selection line. The gate electrodes 220 may include a metal material such as tungsten, copper, and metal silicide.

The interlayered insulating layers 140 may be formed to have at least two different thicknesses. For example, the lowermost one of the interlayered insulating layers 140 may be thicker than the others of the interlayered insulating layers. The interlayered insulating layers 140 may include an insulating material such as silicon oxide, silicon nitride, and silicon oxynitride. The gate electrodes 220 and the interlayered insulating layers 140 may be alternatingly stacked on the cell array region CAR.

The vertical channel structures 200a may penetrate the gate electrodes 220 and the interlayered insulating layers 140 vertically and may be in contact with semiconductor patterns 190. The ground selection transistor GST, the memory cell transistors MCT, and the string selection transistor SST may be provided at intersections between each vertical channel structure 200a and the gate electrodes 220. Each of the vertical channel structures 200a may include a first gate dielectric pattern 201a, a first vertical channel pattern 203a, and a first insulating gap-fill pattern 205a. The first vertical channel pattern 203a may be electrically connected to the substrate 100 through the semiconductor patterns 190. The vertical channel structures 200a may have a bottom surface positioned at a higher level than a top surface of the lowermost one of the gate electrodes 220.

As shown in FIG. 3A, the vertical channel structures 200a may be two-dimensionally arranged, when viewed in plan view. The vertical channel structures 200a may be disposed to form a zigzag arrangement.

The common source line CSL may be provided to vertically penetrate the gate electrodes 220 and the interlayered insulating layers 140. An impurity region 211 may be provided in a portion of the substrate 100, which is in contact with the common source line CSL, and a trench spacer 225 may be provided to cover a sidewall of the common source line CSL. The impurity region 211 may contain impurities (e.g., P or As) injected into the substrate 100. The common source line CSL may penetrate the gate electrodes 220 and the interlayered insulating layers 140 vertically and may be in contact with the impurity region 211. The common source line CSL may be shaped like a dam. For example, when viewed in a top plan view, the common source line CSL may be shaped like a line or bar extending along a specific direction. The trench spacer 225 may be formed between the common source line CSL and the gate electrodes 220. The trench spacer 225 may be provided on the sidewall of the common source line CSL. The trench spacer 225 may separate the common source line CSL electrically from the gate electrodes 220. The trench spacer 225 may include at least one insulating material such as silicon oxide, silicon nitride, and silicon oxynitride.

The interconnection plugs 245 may be provided to connect the gate electrodes 220 electrically to the metal lines 260. In certain embodiments, the interconnection plugs 245 may be formed to vertically penetrate an upper interlayered insulating layer 235, an upper insulating layer 175, a lower insulating pattern 165, or a peripheral insulating layer 120. Each of the interconnection plugs 245 may be connected to a corresponding one of the string selection gate electrode, the memory cell gate electrodes, and the ground selection gate electrode. As shown in FIG. 3A, when viewed in a plan view, on the word line contact region WCTR, the interconnection plugs 245 may be formed on a virtual straight line crossing centers of the gate electrodes 220. On the peripheral circuit region PERI, the interconnection plugs 245 may be respectively connected to a horizontal gate electrode 112 and a source/drain region 113 of the horizontal transistor 110.

The dummy pillars 200b may be provided to penetrate the gate electrodes 220 and the interlayered insulating layers 140 and be in contact with the device isolation layer 102 of the word line contact region WCTR. The dummy pillars 200b may include a second gate dielectric pattern 201b, a second vertical channel pattern 203b, and a second insulating gap-fill pattern 205b. Top surfaces of the dummy pillars 200b may be positioned at substantially the same level as those of the vertical channel structures 200a. Bottom surfaces of the dummy pillars 200b may be positioned at a lower level than those of the vertical channel structures 200a.

The dummy pillars 200b may be provided on boundaries of the gate electrodes 220. As shown in FIG. 3A, when viewed in plan view, the dummy pillars 200b penetrating the gate electrodes 220 may be arranged to surround the interconnection plugs 245 connected to gate electrodes 220.

The dummy pillars 200b may be the same shape and structure as the vertical channel structures 200a.

On the cell array region CAR, the semiconductor patterns 190 may protrude from the substrate 100 and may be interposed between the vertical channel structures 200a and the substrate 100. Top surfaces of the semiconductor patterns 190 may be positioned at a higher level than that of the lowermost one of the gate electrodes 220. The semiconductor patterns 190 may be in direct contact with the first vertical channel patterns 203a of the vertical channel structures 200a. Accordingly, the first vertical channel patterns 203a may be electrically connected to the substrate 100 through the semiconductor patterns 190. The semiconductor patterns 190 may be formed by a selective epitaxial growth (SEG) process using the top surface of the substrate 100 as a seed layer. Accordingly, the semiconductor patterns 190 may be formed in channel holes 180a exposing the top surface of the substrate 100 and may not be formed in dummy holes 180b.

A lower gate insulating layer 101 may be provided on the cell array region CAR. The lower gate insulating layer 101 may be interposed between the lowermost one of the gate electrodes 220 and the substrate 100. The lower gate insulating layer 101 may include an insulating material such as silicon oxide, silicon nitride, and silicon oxynitride.

The lower insulating pattern 165 may be disposed between the word line contact region WCTR and the peripheral circuit region PERI. On the word line contact region WCTR, the lower insulating pattern 165 may be provided to cover top and side surfaces of the interlayered insulating layer 140 and the gate electrodes 220, a side surface of the peripheral insulating layer 120, and a top surface of the device isolation layer 102. A top surface of the lower insulating pattern 165 may be coplanar with a top surface of the peripheral insulating layer 120. The lower insulating pattern 165 may include an insulating material (e.g., silicon oxide).

A plurality of horizontal transistors 110 may be provided on the peripheral circuit region PERI of the substrate 100 to form a peripheral circuit. Each of the horizontal transistors 110 may include a horizontal gate insulating pattern 111, a horizontal gate electrode 112, source/drain regions 113, and gate spacers 115. The horizontal transistors 110 may be covered with the peripheral insulating layer 120.

The upper insulating layer 175 may be formed to cover top and side surfaces of the interlayered insulating layers 140 and the gate electrodes 220, on the word line contact region WCTR, and cover top surfaces of the lower insulating pattern 165 and the peripheral insulating layer 120. Further, the upper insulating layer 175 may be formed to surround side surfaces of the dummy pillars 200b and the interconnection plugs 245. For example, the dummy pillars 200b and the interconnection plugs 245 may be formed to vertically penetrate the upper insulating layer 175. The upper insulating layer 175 may be coplanar with the uppermost one of the interlayered insulating layers 140.

The upper interlayered insulating layer 235 may be formed on the uppermost one of the interlayered insulating layers 140 and the upper insulating layer 175 to cover the vertical channel structures 200a, the common source line CSL, and the dummy pillars 200b. The upper interlayered insulating layer 235 may be formed to surround side surfaces of the interconnection plugs 245 and bit line plugs 240. For example, the bit line plugs 240 and the interconnection plugs 245 may be formed to vertically penetrate the upper interlayered insulating layer 235.

Each of the upper insulating layer 175 and the upper interlayered insulating layer 235 may be formed of or include at least one of high density plasma (HDP) oxide, TetraEthylOrthoSilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), Tonen SilaZene (TOSZ), or any combination thereof.

The bit lines BL may be formed on the upper interlayered insulating layer 235. The bit lines BL may include a metallic material such as tungsten (W).

The bit line plugs 240 may be provided between the bit lines BL and the vertical channel structures 200a. The bit line plugs 240 may connect the bit lines BL electrically to the vertical channel structures 200a. The bit line plugs 240 may include a conductive material such as doped silicon, metal silicides, and metals.

The metal lines 260 may be provided on the upper interlayered insulating layer 235. For example, on the word line contact region WCTR and the peripheral circuit region PERI, the metal lines 260 may be aligned with the interconnection plugs 245. The metal lines 260 may be electrically connected to the gate electrodes 220 and the horizontal transistor 110 through the interconnection plugs 245.

According to example embodiments of the inventive concept, in the three-dimensional semiconductor device, the semiconductor patterns 190 may be formed in the channel holes 200a but not in the dummy holes 200b. This makes it possible to reduce dispersion in the selective epitaxial growth (SEG) process for forming the semiconductor patterns 190. As a result, it is possible to improve uniformity of the semiconductor patterns 190, which are formed on the cell array region CAR, and thereby to realize a three-dimensional semiconductor device with improved electric characteristics.

Referring to FIGS. 3B and 4B, a three-dimensional semiconductor device 10b according to other example embodiments of the inventive concepts may include a substrate 100 including a cell array region CAR, a word line contact region WCTR, and a peripheral circuit region PERI. The substrate 100 may include a first substrate 100a and a second substrate 100b. The first substrate 100a may be provided below the second substrate 100b. The peripheral circuit region PERI may be provided in the first substrate 100a, and the cell array region CAR and the word line contact region WCTR may be provided in the second substrate 100b. Horizontal transistors 110 may be integrated on the first substrate 100a to form a peripheral circuit. In this case, each of the horizontal transistors 110 may include a horizontal gate insulating pattern 111, a horizontal gate electrode 112, source/drain regions 113, and gate spacers 115. A first peripheral insulating layer 120a may be provided on the first substrate 100a with the horizontal transistors 110. Peripheral metal lines 116 and a second peripheral insulating layer 120b may be provided on the first peripheral insulating layer 120a to connect the horizontal transistors 110 electrically to each other.

According to the present embodiments, the horizontal transistors 110 constituting the peripheral circuit may be formed on the first substrate 100a, the peripheral insulating layer 120 may be formed to cover the horizontal transistors 110, and then, the second substrate 100b may be disposed on the peripheral insulating layer 120. The peripheral insulating layer 120 may include the first peripheral insulating layer 120a and the second peripheral insulating layer 120b. A device isolation layer 102 may be provided on the second substrate 100b to define active regions. Elements provided on the cell array region CAR and word line contact region WCTR of the second substrate 100b may be configured to have substantially the same features as those of the previous embodiments of FIG. 4A, and thus, detailed description thereof will be omitted.

In order to reduce complexity in the drawings, FIG. 4B shows one peripheral metal line 116 that is connected to the interconnection plug 245. However, other peripheral metal lines 116 provided at other positions may be respectively connected to others of the interconnection plugs 245.

Figure 5C:
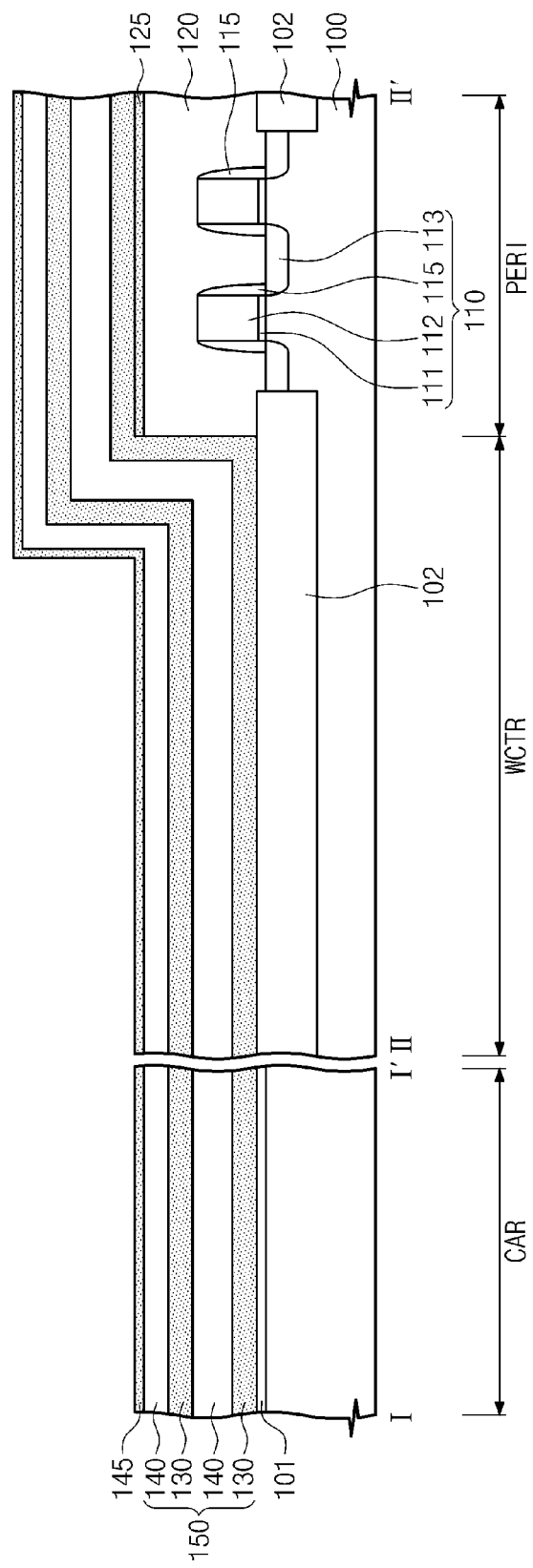
FIGS. 5A through 5Q are sectional views taken along lines I-I' and II-II' of FIG. 3A to illustrate a method of fabricating a semiconductor device according to example embodiments of the inventive concept.
Figure 5D:
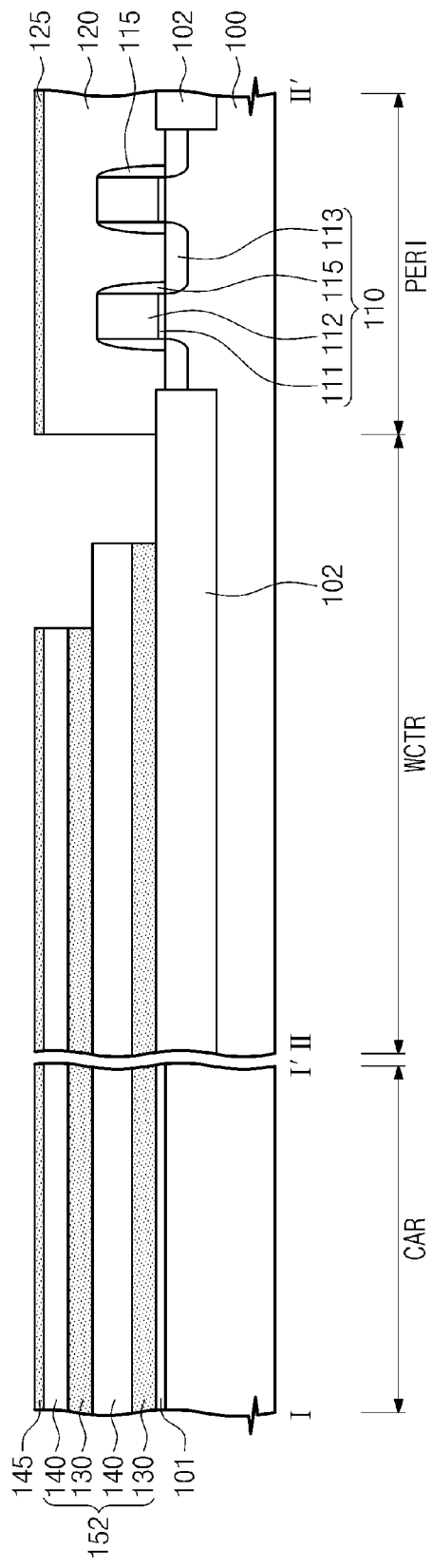
Figure 5E:
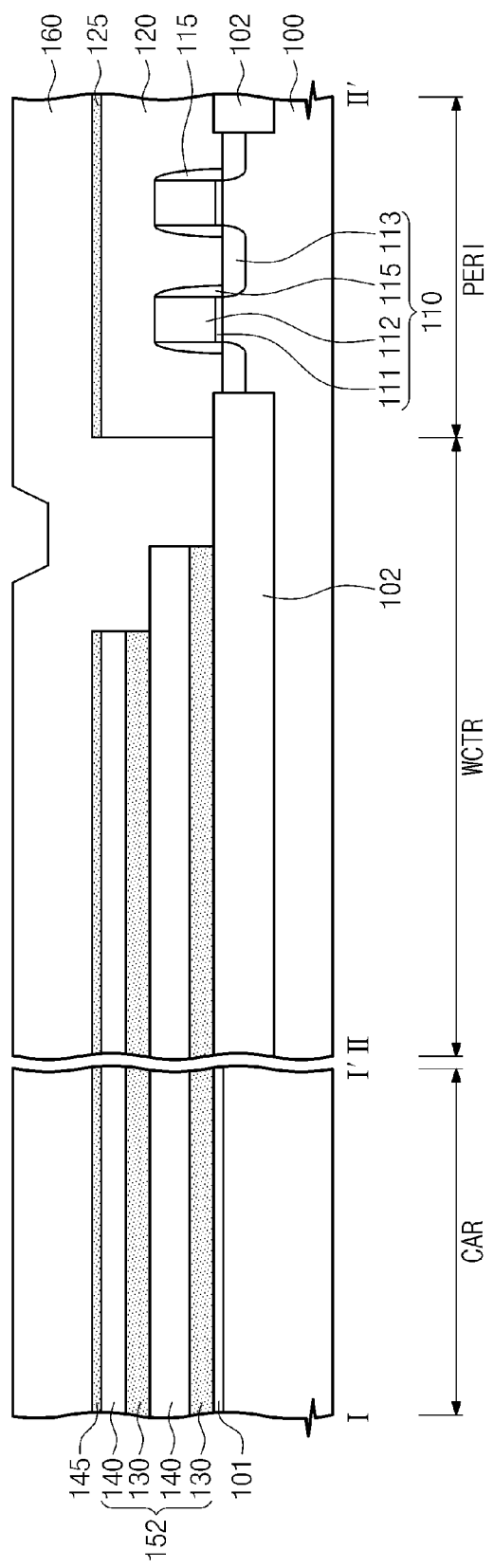
Figure 5F:
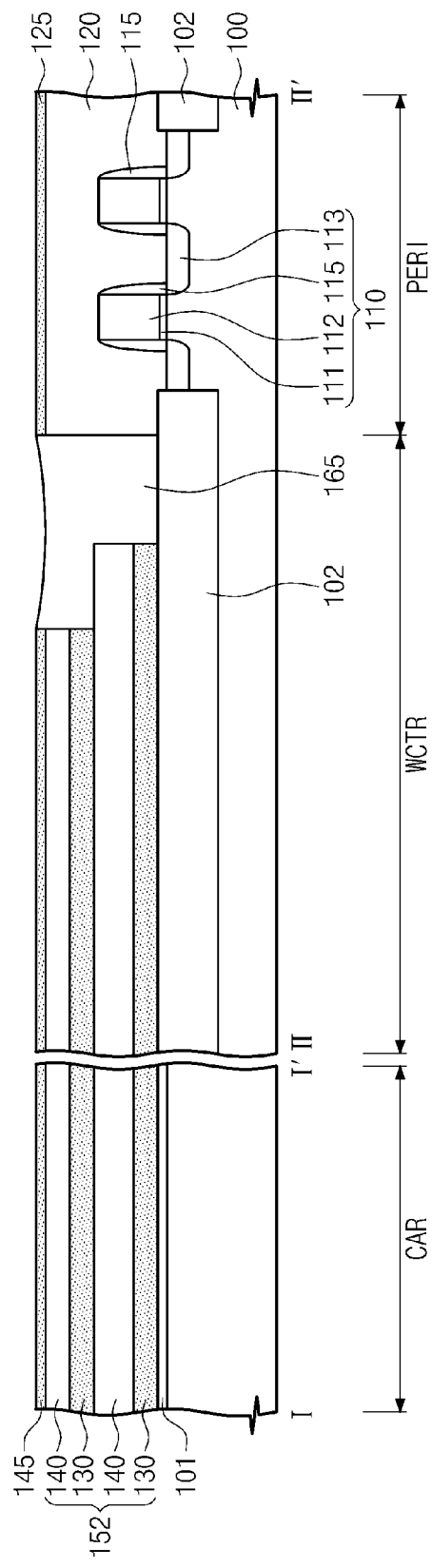
Figure 5H:
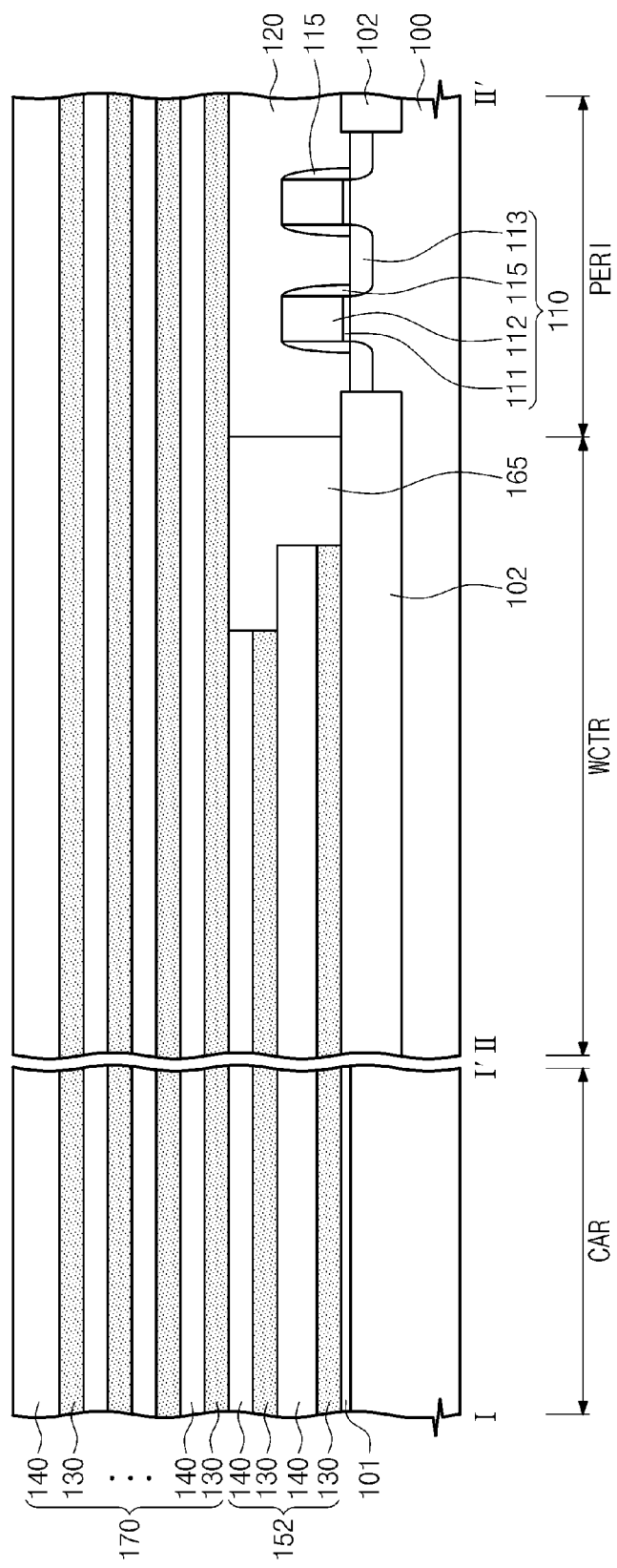
Figure 5I:
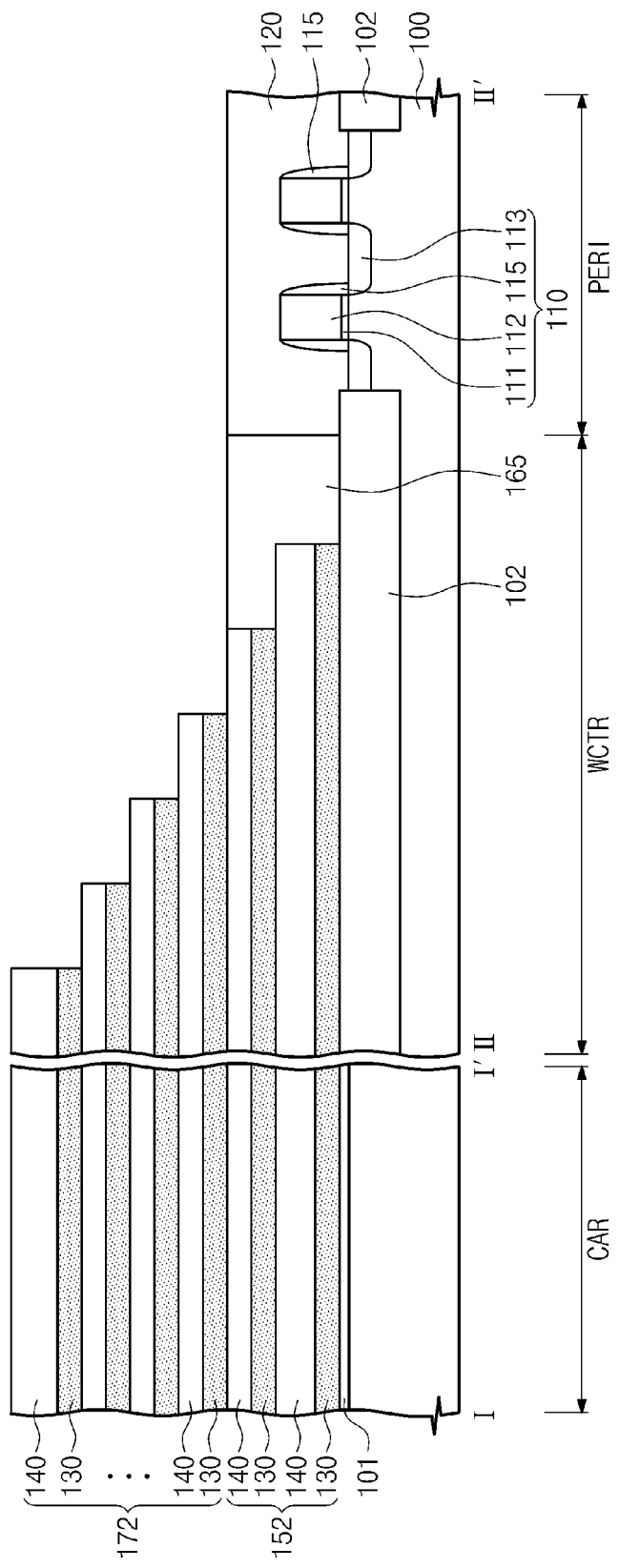
Figure 5J:
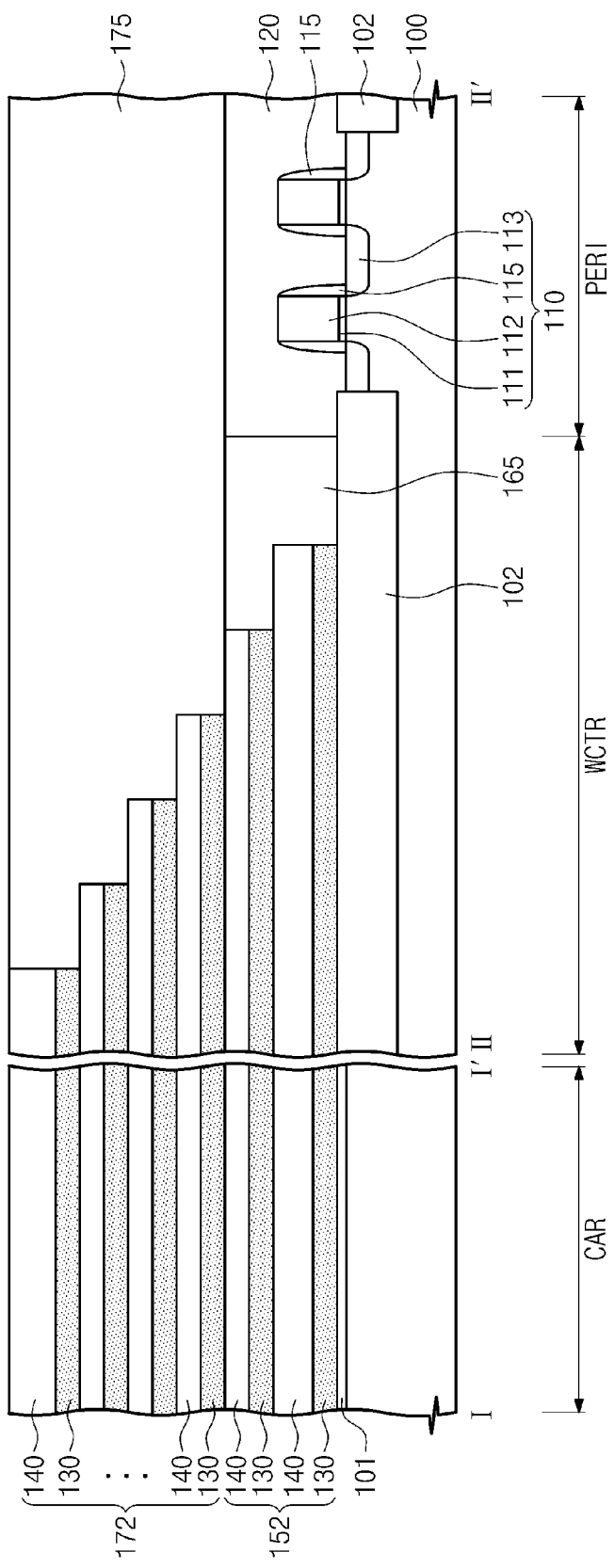
Figure 5K:
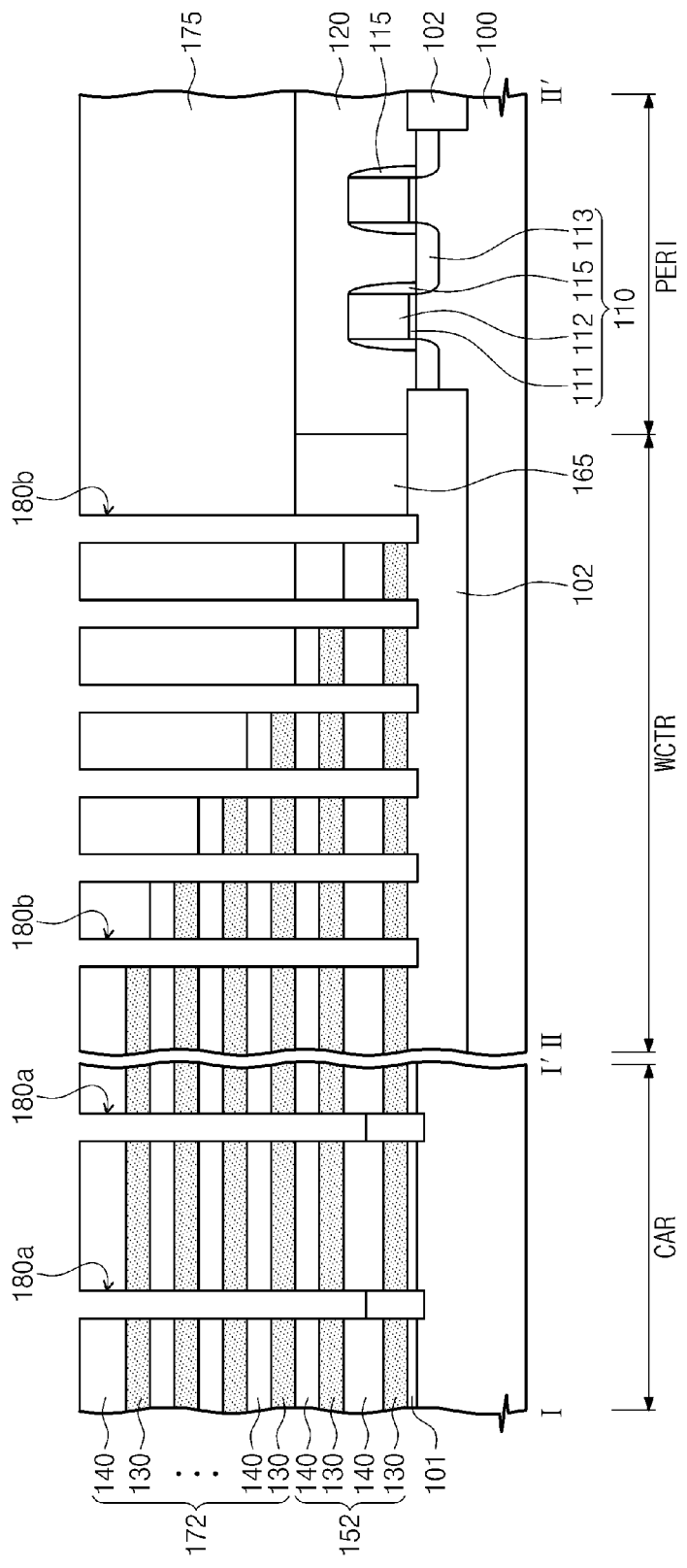
Figure 5M:
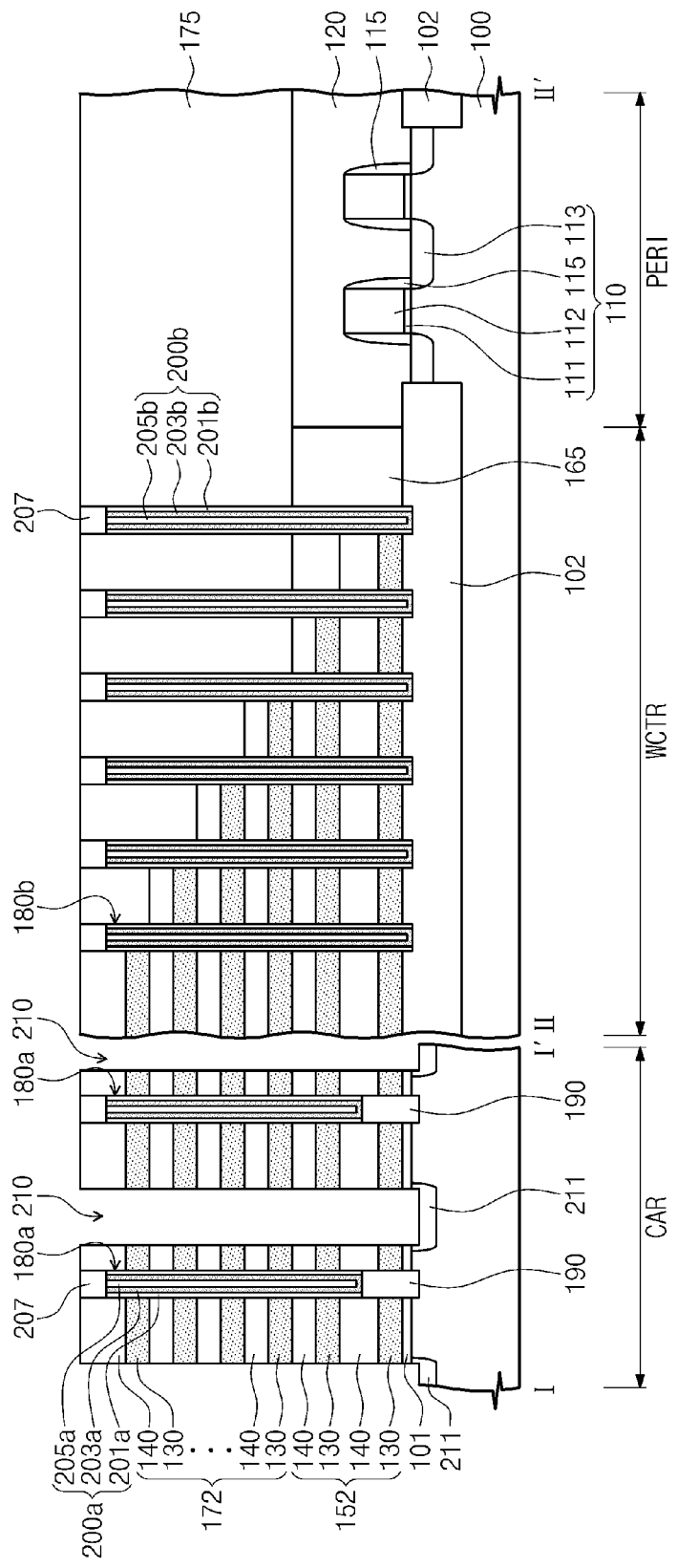
Figure 5N:
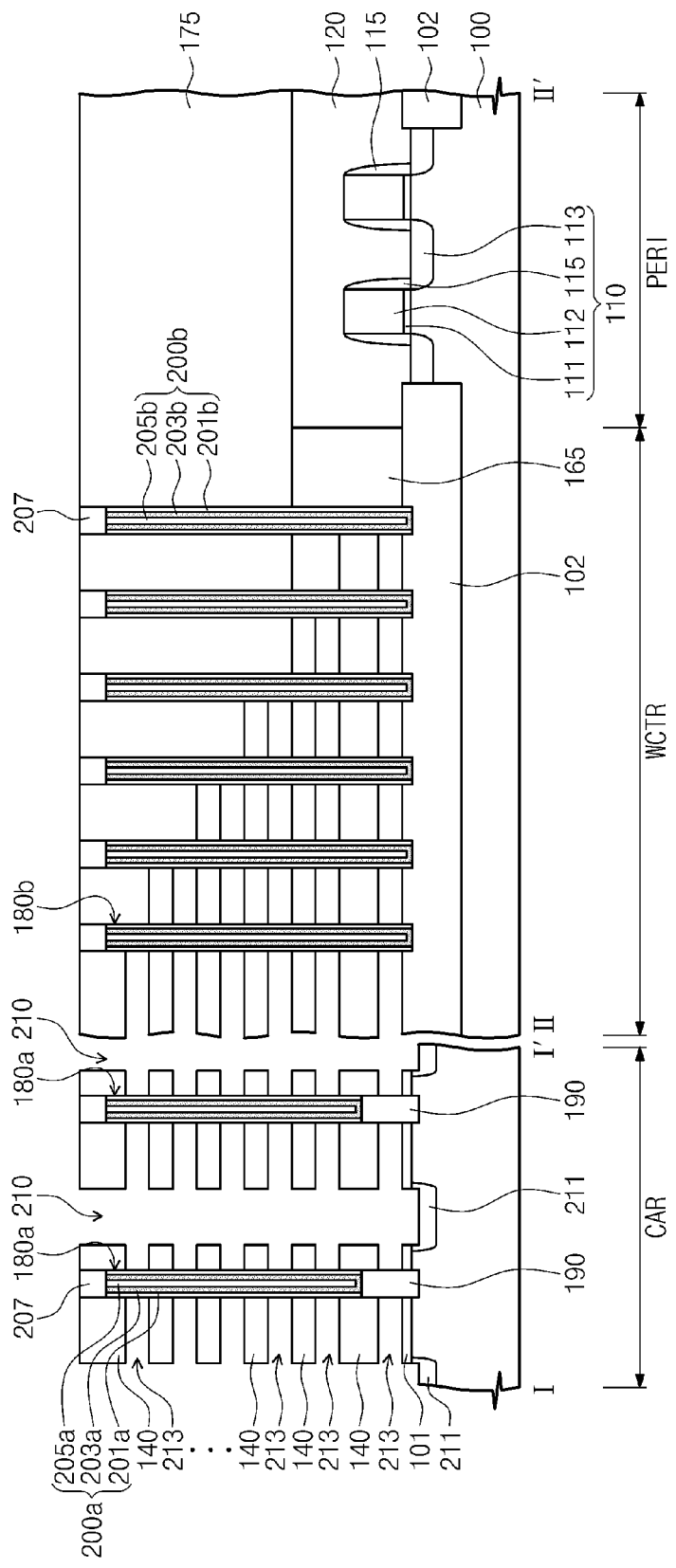
Figure 50:
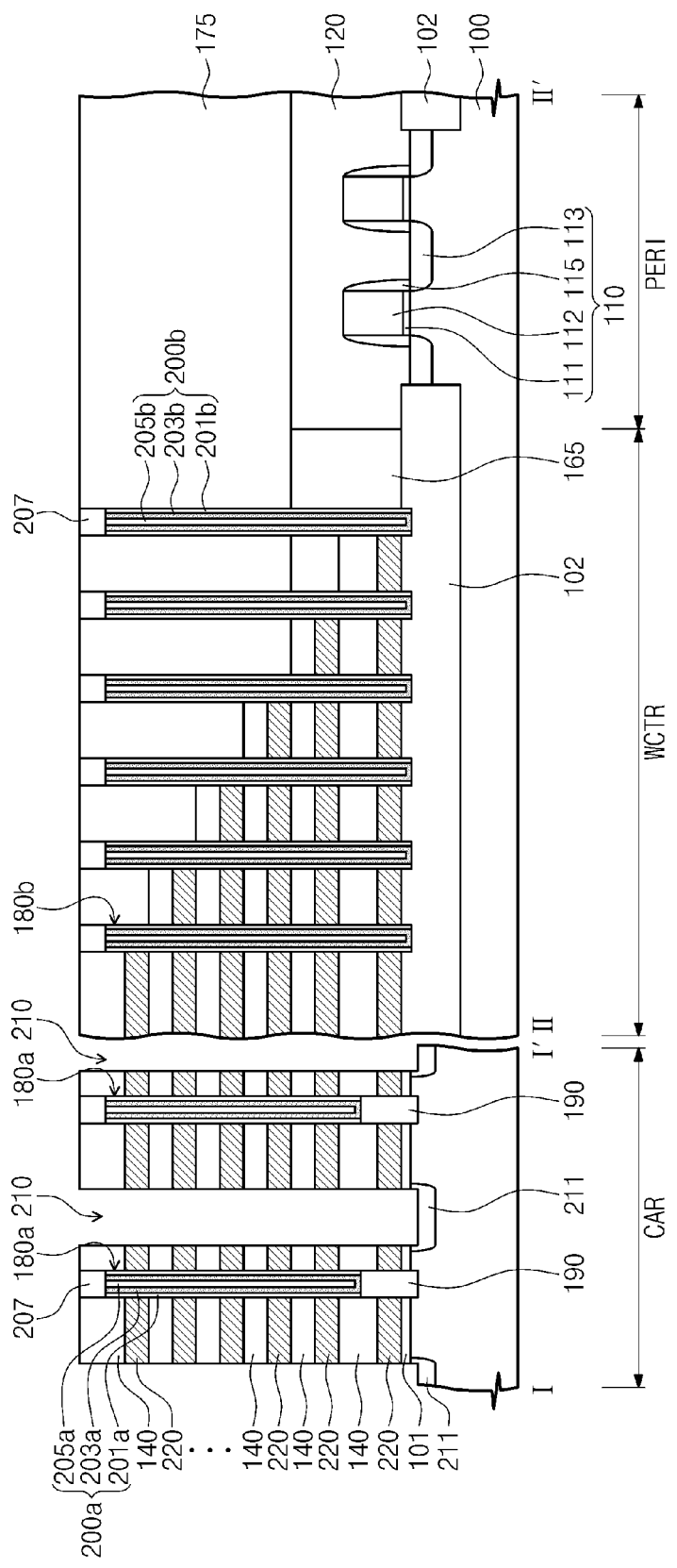
Figure 5P:
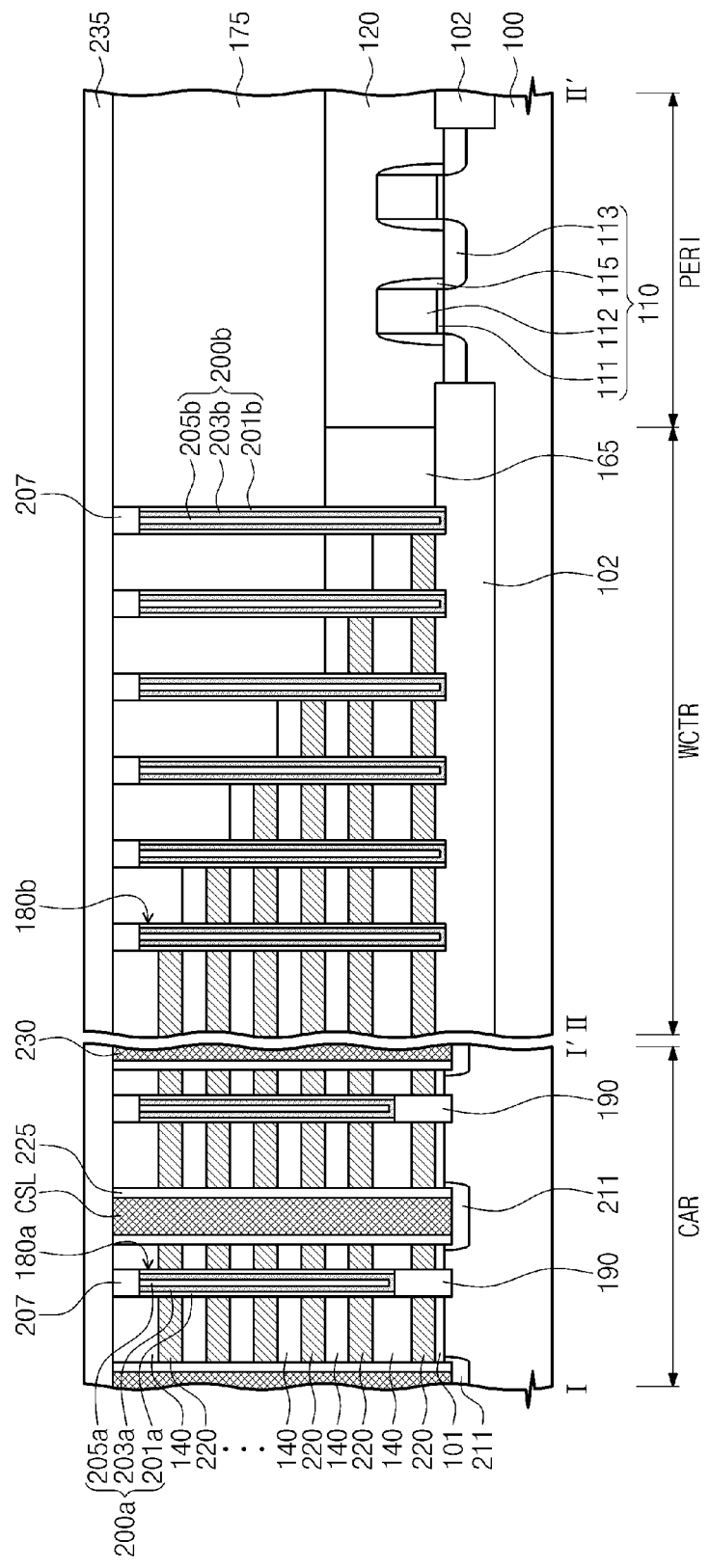
Figure 5Q:
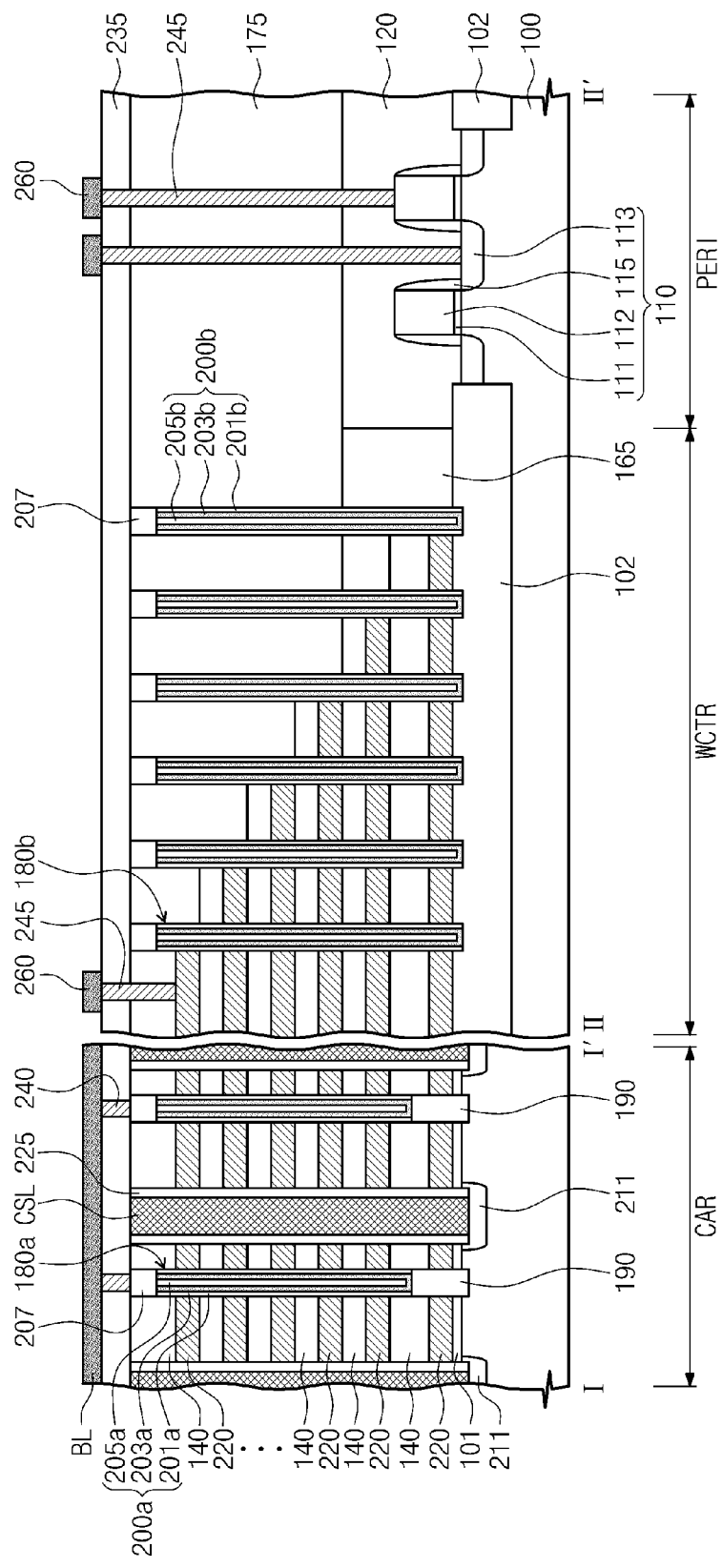

FIGS. 5A through 5Q are sectional views taken along lines I-I' and II-II' of FIG. 3A to illustrate a method of fabricating a semiconductor device 10a according to example embodiments of the inventive concept.

Referring to FIG. 5A, the device isolation layer 102 may be formed on the substrate 100 to define the active regions. The device isolation layer 102 may be formed by a shallow trench isolation (STI) process. The STI process may include patterning the substrate 100 to form isolation trenches and filling the isolation trenches with an insulating material (e.g., silicon oxide). The substrate 100 may be formed of or include a material exhibiting a semiconductor property. For example, the substrate 100 may be provided in the form of a silicon wafer. The substrate 100 may include the cell array region CAR, the peripheral circuit region PERI, and the word line contact region WCTR.

Referring to FIG. 5B, a plurality of horizontal transistors 110 may be formed on the peripheral circuit region PERI. Each of the horizontal transistors 110 may include the horizontal gate electrode 112, the horizontal gate insulating pattern 111, the source/drain regions 113, and the gate spacers 115. The peripheral insulating layer 120 and a peripheral sacrificial layer 125 may be formed to cover the peripheral circuit region PERI of the substrate 100.

In example embodiments, the formation of the peripheral circuits may include forming the word line driver, the sense amplifier, the row decoder, the column decoder, and the control circuits described with reference to FIG. 1. For example, as shown in FIG. 5B, the horizontal transistors 110 constituting the peripheral circuits may be formed on the peripheral circuit region PERI of the substrate 100 as follow. In more detail, a horizontal gate insulating layer and a horizontal gate layer may be sequentially stacked on the substrate 100. The horizontal gate insulating layer and the horizontal gate layer may be patterned to form the horizontal gate electrode 112 and the horizontal gate insulating pattern 111. The horizontal gate electrode 112 may be formed of a doped polysilicon or a metallic material. The horizontal gate insulating pattern 111 may be formed of or include a silicon oxide layer, which may be formed by a thermal oxidation process. Thereafter, the source/drain regions 113 and the gate spacers 115 may be formed on both sides of each of the horizontal gate electrodes 112.

The peripheral insulating layer 120 may be formed by depositing an insulating layer on the substrate 100 and planarizing the insulating layer. The peripheral insulating layer 120 may include, for example, silicon oxide. On the peripheral insulating layer 120, the peripheral sacrificial layer 125 may be formed by a deposition process. The peripheral sacrificial layer 125 may include a material having an etch selectivity with respect to the peripheral insulating layer 120. For example, the peripheral sacrificial layer 125 may include at least one of silicon nitride, silicon oxynitride, silicon carbide, or silicon oxycarbide.

The peripheral insulating layer 120 and the peripheral sacrificial layer 125 may be patterned to locally remain the peripheral circuit region PERI of the substrate 100. In other words, the peripheral insulating layer 120 and the peripheral sacrificial layer 125 may be formed to expose the substrate 100 on the cell array region CAR and the device isolation layer 102 on the word line contact region WCTR.

Referring to FIG. 5C, a lower layered structure 150 may be formed to cover the whole top surface of the substrate 100 provided with the horizontal transistors 110.

In example embodiments, the lower layered structure 150 may be formed on the cell array region CAR, the word line contact region WCTR, and the peripheral circuit region PERI. The lower layered structure 150 may be formed to conformally cover the whole top surface of the substrate 100 provided with the peripheral insulating layer 120 and peripheral sacrificial layer 125. Accordingly, the lower layered structure 150 may cover a sidewall of the peripheral insulating layer 120 and a top surface of the peripheral sacrificial layer 125.

The lower layered structure 150 may include a plurality of interlayered insulating layers 140 and a plurality of sacrificial layers 130. The interlayered insulating layers 140 and the sacrificial layers 130 may be formed using a deposition process and may be alternatingly and repeatedly stacked one on another, as shown in FIG. 5C.

The interlayered insulating layers 140 and the sacrificial layers 130 may be formed of materials capable of having an etch selectivity in a wet etching process. For example, the interlayered insulating layers 140 may be at least one of a silicon oxide layer or a silicon nitride layer, and the sacrificial layers 130 may be a layer that is selected from a silicon layer, a silicon oxide layer, a silicon carbide layer, and a silicon nitride layer to have an different etch rate from the interlayered insulating layers 140.

The uppermost layer of the lower layered structure 150 may be a cell sacrificial layer 145. The cell sacrificial layer 145 may include the same material as the peripheral sacrificial layer 125. The cell sacrificial layer 145 may be formed of or include an insulating material having an etch selectivity with respect to the interlayered insulating layer 140 or the sacrificial layer 130. For example, the cell sacrificial layer 145 may be formed of at least one selected from the group consisting of silicon, silicon oxide, silicon oxynitride, silicon carbide, and silicon oxycarbide. In example embodiments, in the case where the cell sacrificial layer 145 is formed on the interlayered insulating layer 140 made of silicon oxide, the cell sacrificial layer 145 may be formed of silicon nitride.

Before the formation of the lower layered structure 150, the lower gate insulating layer 101 may be formed on the substrate 100 using, for example, a thermal oxidation process. Since the lower gate insulating layer 101 is formed by the thermal oxidation process, it may be locally formed on the cell array region CAR of the substrate 100, whose top surface is exposed.

Referring to FIG. 5D, the lower layered structure 150 may be patterned to form a lower cell structure 152 on the cell array region CAR of the substrate. The lower cell structure 152 may be a staircase structure formed by patterning the lower layered structure 150 several times. The lower cell structure 152 may extend from the cell array region CAR to the word line contact region WCTR and may have a staircase contact portion on the word line contact region WCTR. Since the lower cell structure 152 is formed to have the staircase structure, end portions of the interlayered insulating layers 140 and the sacrificial layers 130 may be positioned on the word line contact region WCTR. Areas of the interlayered insulating layers 140 and the sacrificial layers 130 may decrease with increasing distance from the substrate 100. In other words, as a vertical distance from the substrate 100 increases, a horizontal distance from the peripheral circuit region PERI to a sidewall of the sacrificial layers 130 or the interlayered insulating layers 140 may increase.

In example embodiments, as a result of the patterning of the lower layered structure 150, the device isolation layer 102 may be partially exposed on the word line contact region WCTR adjacent to the peripheral circuit region PERI. Further, as a result of the patterning of the lower layered structure 150, the peripheral sacrificial layer 125 and the peripheral insulating layer 120 may be exposed on the peripheral circuit region PERI.

Referring to FIG. 5E, a lower insulating layer 160 may be formed to cover the lower cell structure 152, the device isolation layer 102, the peripheral sacrificial layer 125, and the peripheral insulating layer 120.

The lower insulating layer 160 may be formed using a chemical mechanical deposition (CVD) process and may be conformally deposited on the cell array region CAR, the word line contact region WCTR, and the peripheral circuit region PERI of the substrate 100. The lower insulating layer 160 may be formed of a material having an etch selectivity with respect to the sacrificial layers 130, the cell sacrificial layer 145, and the peripheral sacrificial layer 125 of the lower cell structure 152.

For example, the lower insulating layer 160 may be formed of or include at least one of high density plasma (HDP) oxide, TetraEthylOrthoSilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), Tonen SilaZene (TOSZ), or any combination thereof. In certain embodiments, the lower insulating layer 130 may be formed of or include at least one of silicon nitride, silicon oxynitride, or low-k dielectric materials.

Referring to FIG. 5F, a planarization process may be performed to planarize the lower insulating layer 160. In the planarization process, the cell sacrificial layer 145 and the peripheral sacrificial layer 125 may be used as an end detection point for determining to terminate the planarization process. By performing the planarization process, it is possible to remove a non-uniform portion of the lower insulating layer 160. For example, as a result of the planarization process, the lower insulating pattern 165 with a substantially flat top surface may be locally formed between the lower cell structure 152 and the peripheral insulating layer 120.

The planarization process of the lower insulating layer 160 may include a chemical mechanical polishing (CMP) process. During the CMP process, the lower insulating layer 160 may be mechanically polished using a polishing pad configured to rotate on the substrate 100 (i.e., wafer), and at the same time, may be chemically etched using a polishing solution with slurries, which may be supplied between the substrate 100 and the polishing pad.

In the CMP process, a removal rate of the lower insulating layer 160 may be affected by various factors, such as a type of the slurry, configuration of the polishing pad, a structure and type of a polishing head, a rotating speed of the polishing pad relative to the substrate 100, a pressure applied to the substrate 100 from the polishing pad, and the material and shape of the lower insulating layer 160. Further, the slurry to be supplied during the CMP process may be one selected to exhibit an excellent polishing property with respect to a target material. In other words, the removal rate of the lower insulating layer 160 may vary depending on the type of the slurry to be used in the CMP process.

In example embodiments, the CMP process may be performed using a slurry that is selected to be able to realize an etch selectivity (e.g., of 4:1 through 10:1) between the lower insulating layer 160 and the peripheral and cell sacrificial layers 125 and 145. For example, the slurries for the CMP process may include at least one selected from silica, ceria, mangania, alumina, titania, zirconia, germania, or any combination thereof. In the case where the lower insulating layer 160 is formed of a silicon oxide layer and the peripheral and cell sacrificial layers 125 and 145 are formed of a silicon nitride layer, silica and/or ceria slurries may be used for the CMP process.

Furthermore, an end-point detection (EPD) technique may be employed to control the CMP process. In the EPD technique, a polishing state of the lower insulating layer 160 may be monitored to exactly determine a time when the CMP process should be finished. In example embodiments, the end point of the CMP process may be determined in consideration of a variation in physical property (e.g., rotating speed) of the polishing pad and/or a variation in optical property of a monitoring light, which may occur when an underlying layer is exposed. This is because such a variation may result from a difference in removal rate between the underlying layer and the lower insulating layer 160, which can be effectively measured when the underlying layer is exposed. In other embodiments, a process time of the CMP process may be controlled by monitoring a remaining thickness of the lower insulating layer 160.

During the CMP process on the lower insulating layer 160, the cell sacrificial layer 145 may prevent the interlayered insulating layer 140 thereunder from being polished, and the peripheral sacrificial layer 125 may prevent the peripheral insulating layer 120 thereunder from being polished.

Referring to FIG. 5G, the cell sacrificial layer 145 and the peripheral sacrificial layer 125 may be removed. Accordingly, the lower cell structure 152, the lower insulating pattern 165, and the peripheral insulating layer 120 may have top surfaces that area coplanar with each other.

For example, to remove the cell sacrificial layer 145 and the peripheral sacrificial layer 125, an anisotropic or isotropic etching process may be performed using an etch recipe having an etch selectivity with respect to the interlayered insulating layer 140, the lower insulating pattern 165, and the peripheral insulating layer 120 of the lower cell structure 152. In example embodiments, in the case where the cell sacrificial layer 145 and the peripheral sacrificial layer 125 are formed of a silicon nitride layer, they may be removed by an isotropic etching process, in which an etching solution containing phosphoric acid is used.

Referring to FIG. 5H, an upper layered structure 170 may be formed on the lower cell structure 152, the lower insulating pattern 165, and the peripheral insulating layer 120.

Similar to the lower layered structure 150, the upper layered structure 170 may include a plurality of interlayered insulating layers 140 and a plurality of sacrificial layers 130, which may be alternatingly stacked on the substrate 100. The interlayered insulating layers 140 and the sacrificial layers 130 may be formed using a deposition process.

Referring to FIG. 5I, the upper layered structure 170 may be patterned to form an upper cell structure 172 on the lower cell structure 152. The upper cell structure 172 may be formed by patterning the upper layered structure 170 several times. The patterning of the upper layered structure 170 may be performed to remove the upper layered structure 170 from the peripheral circuit region PERI and the word line contact region WCTR and thereby expose the lower insulating pattern 165 and the peripheral insulating layer 120 on the peripheral circuit region PERI and the word line contact region WCTR.

The upper cell structure 172 may extend from the cell array region CAR to the word line contact region WCTR and may include a staircase contact portion. On the word line contact region WCTR, the upper cell structure 172 may be formed in such a way that the contact portion thereof forms a continuously-connected staircase structure, in conjunction with the contact portion of the lower cell structure 152. The contact portion may be used for electrical connection with the interconnection plug 245 or the metal lines 260, which will be formed in a subsequent process. In example embodiments, the number of the sacrificial layers 130, which constitute the lower and upper cell structures 152 and 172 on the cell array region CAR, may be equal to the number of the gate electrodes 220 to be vertically stacked on the cell array region CAR.

In example embodiments, all of the sacrificial layers 130 of the lower and upper cell structures 152 and 172 may have substantially the same thickness. In other embodiments, the uppermost and lowermost ones of the sacrificial layers 130 may be formed to be thicker than the others of the sacrificial layers 130. Further, of the lower and upper cell structures 152 and 172, the number, thicknesses, and materials of layers may be variously changed in consideration of technical factors (e.g., technical difficulty in a patterning process or electric characteristics of memory cell transistors).

Referring to FIG. 5J, an upper insulating layer 175 may be formed on the peripheral circuit region PERI and the word line contact region WCTR of the substrate 100.

The upper insulating layer 175 may be formed of a material having an etch selectivity with respect to the sacrificial layers 130, when the sacrificial layers 130 are removed from the lower and upper cell structure 152 and 172. The upper insulating layer 175 may be formed using one of physical vapor deposition (PVD), chemical vapor deposition (CVD), sub-atmospheric chemical vapor deposition (SACVD), low pressure chemical vapor deposition (LPCVD), plasma enhanced chemical vapor deposition (PECVD), and high density plasma chemical vapor deposition (HDP CVD) processes. By using such a deposition technique, the upper insulating layer 175 may be conformally deposited on the cell array region CAR, the word line contact region WCTR, and the peripheral circuit region PERI of the substrate 100.

Thereafter, a planarization process may be performed on the upper insulating layer 175. The planarized upper insulating layer 175 may cover the upper cell structure 172, the lower insulating pattern 165, and the peripheral insulating layer 120.

The upper insulating layer 175 may be formed of or include at least one of high density plasma (HDP) oxide, TetraEthylOrthoSilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), Tonen SilaZene (TOSZ), or any combination thereof. In certain embodiments, the lower insulating layer 130 may be formed of or include at least one of silicon nitride, silicon oxynitride, or low-k dielectric materials.

Referring to FIG. 5K, channel holes 180a may be formed on the cell array region CAR, and dummy holes 180b may be formed on the word line contact region WCTR. Semiconductor patterns 190 may be formed to partially fill lower portions of the channel holes 180a.

In example embodiments, the formation of the channel holes 180a may include forming a mask pattern (not shown) on the upper cell structure 172 and then anisotropically etching the upper and lower cell structures 172 and 152 and the lower gate insulating layer 101 using the mask pattern (not shown) as an etch mask to expose the top surface of the substrate 100. The channel holes 180a may be formed to expose sidewalls of the sacrificial layers 130 and the interlayered insulating layers 140. Further, the channel holes 180a may be formed to penetrate the lower gate insulating layer 101 and expose the top surface of the substrate 100. In example embodiments, during the formation of the channel holes 180a, the top surface of the substrate 100 exposed by the channel holes 180a may be over-etched to form a recessed region with a specific depth. Here, the top surface of the substrate 100 may be that of the active region of the cell array region CAR; that is, the channel holes 180a may be formed to expose the active region of the cell array region CAR.

In example embodiments, the formation of the dummy holes 180b may include anisotropically etching the upper insulating layer 175 and the upper and lower cell structures 172 and 152 using the mask pattern (not shown) as an etch mask to expose the device isolation layer 102. The dummy holes 180b may be formed to penetrate the upper insulating layer 175, the sacrificial layers 130, and the interlayered insulating layers 140 and thereby to expose the device isolation layer 102. In example embodiments, during the formation of the dummy holes 180b, the device isolation layer 102 exposed by the dummy hole 180b may be over-etched to form a recessed portion with a specific depth. Each of the channel and dummy holes 180a and 180b may be formed to have a circular shape, when viewed in a top plan view. Further, the channel and dummy holes 180a and 180b may be simultaneously formed by an anisotropic etching process.

In example embodiments, a selective epitaxial growth (SEG) process, in which the top surface of the substrate 100 exposed by the channel holes 180a is used as a seed layer, may be performed to form the semiconductor patterns 190 partially filling lower portions of the channel holes 180a. By contrast, as a result of the SEG process, the semiconductor patterns 190 may not be formed on the device isolation layer 102 exposed by the dummy holes 180b. This is because the device isolation layer 102 is formed of an insulating layer (e.g., silicon oxide), which cannot be used as a seed layer of the SEG process. Accordingly, the semiconductor patterns 190 may be locally formed in only the channel holes 180a on the cell array region CAR, and this makes it possible to reduce dispersion in the selective epitaxial growth (SEG) process for forming the semiconductor patterns 190. The semiconductor patterns 190 may be formed of or include a single crystalline silicon layer or a single crystalline silicon-germanium layer. In certain embodiments, the semiconductor patterns 190 may be doped with impurities. The semiconductor patterns 190 may be formed in such a way that top surfaces thereof are positioned at a higher level than that of the lowermost one of the sacrificial layers 130.

Referring to FIG. 5L, vertical channel structures 200a and contact pads 207 may be sequentially formed in the channel holes 180a and on the semiconductor patterns 190. At the same time, dummy pillars 200b and the contact pads 207 may be sequentially formed in the dummy holes 180b and on the device isolation layer 102 exposed by the dummy holes 180b.

Each of the vertical channel structures 200a may include a first gate dielectric pattern 201a, a first vertical channel pattern 203a, and a first insulating gap-fill pattern 205a, which are sequentially formed. The vertical channel structures 200a may be in contact with the semiconductor patterns 190 and may be electrically connected to the substrate 100. Bottom surfaces of the vertical channel structures 200a may be positioned at a higher level than a top surface of the lowermost one of the sacrificial layers 130.

Each of the dummy pillars 200b may include a second gate dielectric pattern 201b, a second vertical channel pattern 203b, and a second insulating gap-fill pattern 205b, which are sequentially stacked. The dummy pillars 200b may penetrate the lowermost one of the sacrificial layers 130 and may be in contact with the device isolation layer 102. Accordingly, the dummy pillars 200b may be electrically separated from the substrate 100 by the device isolation layer 102. The dummy pillars 200b may be formed to have bottom surfaces positioned at a lower level than a bottom surface of the lowermost one of the sacrificial layers 130.

Accordingly, the bottom surfaces of the dummy pillars 200b may be positioned below those of the vertical channel structures 200a.

The first and second gate dielectric patterns 201a and 201b may be formed in the channel and dummy holes 180a and 180b, respectively, to have a pipe-shaped structure. Each of the first and second gate dielectric patterns 201a and 201b may include a plurality of insulating layers. For example, each of the first and second gate dielectric patterns 201a and 201b may be formed to include at least two of a silicon oxide layer, a silicon nitride layer, a silicon oxynitride layer, and high-k dielectric layers. Each of the first and second vertical channel patterns 203a and 203b may be formed to have a hollow cylindrical shape or a cup shape. The first and second insulating gap-fill patterns 205a and 205b may be formed to fill gap regions, which are respectively defined by the first and second vertical channel patterns 203a and 203b. The first and second vertical channel patterns 203a and 203b may be formed of or include, for example, a doped or undoped (i.e., intrinsic) semiconductor layer. As an example, the first and second vertical channel patterns 203a and 203b may include at least one of silicon (Si), germanium (Ge), or any mixture thereof. The first and second insulating gap-fill patterns 205a and 205b may be formed of an insulating material with an excellent gap-fill property. For example, the first and second insulating gap-fill patterns 205a and 205b may be formed of or include a high-density plasma oxide layer, a spin-on-glass (SOG) layer, or a CVD oxide layer.

The contact pads 207 may be formed on the vertical channel structures 200a and the dummy pillars 200b, respectively. The contact pad 207 may be formed of a doped poly silicon layer or a metallic layer.

Referring to FIG. 5M, a trench 210 may be formed between the vertical channel structures 200a. The trench 210 may be formed to extend between the dummy pillars 200b.

The formation of the trench 210 may include forming a mask pattern (not shown) on the upper cell structure 172 and the upper insulating layer 175 to define a position and a shape of the trench 210, and then, anisotropically etching the upper and lower cell structures 172 and 152 and the upper insulating layer 175 using the mask pattern as an etch mask. The trench 210 may be formed to vertically penetrate the interlayered insulating layers 140, the sacrificial layers 130, the upper insulating layer 175, and the lower gate insulating layer 101 and expose the substrate 100. When viewed in a plan view, the trench 210 may be a line-shaped structure extending from the cell array region CAR to the word line contact region WCTR. The trench 210 may be formed spaced apart from the vertical channel structures 200a and the dummy pillars 200b to expose sidewalls of the upper insulating layer 175, the sacrificial layers 130, the interlayered insulating layers 140, and the lower gate insulating layer 101. In certain embodiments, when viewed in a plan view, the trench 210 may be shaped like a line, bar, or rectangle, and when viewed in a vertical sectional view, the trench 210 may be formed to have a depth capable of exposing the top surfaces of the substrate 100 and the device isolation layer 120. In example embodiments, during the formation of the trench 210, the top surfaces of the substrate 100 and the device isolation layer 102 exposed by the trench 210 may be over-etched to form recessed regions.

In example embodiments, after the formation of the trench 210, an impurity region 211 may be locally formed in a portion of the substrate 100 exposed by the trench 210. The lower and upper cell structures 152 and 172, in which the trench 210 is formed, may be used as an ion mask in an ion implantation process for forming the impurity region 211. Similar to the shape of the trench 210, the impurity region 211 may be formed to have a line shape extending along a specific direction. Due to diffusion of injected impurities, the impurity region 211 may be overlapped with the lower and upper cell structures 152 and 172, when viewed in a plan view. Further, the impurity region 211 may be formed to have a different conductivity type from that of the substrate 100.

Referring to FIG. 5N, an etching process may be performed to remove the sacrificial layers 130 exposed by the sidewall of the trench 210 and thereby form gap regions 213.

The etching process may be performed using an etching solution, which is selected to have an etch selectivity with respect to the interlayered insulating layers 140, the lower gate insulating layer 101, and the upper insulating layer 175, to etch the sacrificial layers 130 isotropically through the trench 210. In the case where the sacrificial layers 130 are formed of a silicon nitride layer and the interlayered insulating layers 140, the lower gate insulating layer 101, and the upper insulating layer 175 are formed of a silicon oxide layer, the etching process may be performed using an etching solution containing phosphoric acid. The gap regions 213 may be horizontally extended from the trench 210 toward regions between the interlayered insulating layers 140 and partially expose sidewalls of the vertical channel structures 200a and the dummy pillars 200b.

Referring to FIG. 5O, gate electrodes 220 may be formed to fill the gap regions 213.

The formation of the gate electrodes 220 may include forming a conductive layer in the gap regions 213 and the trench 210 and then removing the conductive layer from the trench 210 to form the gate electrodes 220 that are vertically separated from each other.

The conductive layer for the gate electrodes 220 may be formed using a deposition process (for example, a chemical vapor deposition or atomic layer deposition process) capable of providing an excellent step coverage property. Accordingly, the conductive layer for the gate electrodes 220 may be formed to fill the gap regions 213 and conformally cover the trench 210. In example embodiments, the conductive layer for the gate electrodes 220 may include at least one of doped polysilicon, tungsten, metal nitrides, or metal silicides. The formation of the conductive layer may include sequentially forming a barrier metal layer (e.g., of metal nitride) and a metal layer (e.g., of tungsten). However, the inventive concepts may not be limited to an embodiment for realizing a FLASH memory device, and thus, a material and a structure for the gate electrode 220 may be variously changed in consideration of technical requirements for a desired device.

According to the present embodiment, the gate electrodes 220 may be used as the string selection line SSL, the ground selection line GSL, and the word lines WL0 to WL3, which were described with reference to FIG. 2. For example, the uppermost and lowermost ones of the gate electrodes 220 may be used as the string and ground selection lines SSL and GSL, respectively, and the others interposed therebetween may be used as the word lines WL0 to WL3. The string and ground selection transistors SST and GST may be formed at intersections between the string and ground selection lines SSL and GSL and the vertical channel structures 200a, and the memory cell transistors MCT may be formed at intersections between the word lines WL and the vertical channel structures 220a.

Referring to FIG. 5P, a trench spacer 225 and a common source line CSL may be formed in the trench 210.

The trench spacer 225 may be formed by depositing an insulating layer, which will be used as the trench spacer 225, on the substrate 100 and then an anisotropic etching process on the insulating layer. The trench spacer 225 may be formed of or include at least one of silicon oxide, silicon nitride, silicon oxynitride, or any insulating material.

The formation of the common source line CSL may include forming a conductive layer (e.g., of tungsten) to fill the trench 210 provided with the trench spacer 225 and then performing an etch-back process or a chemical mechanical polishing (CMP) process on the conductive layer. The common source line CSL may be in contact with and be electrically connected to the impurity region 211. In example embodiments, the formation of the common source line CSL may include sequentially forming a barrier metal layer (e.g., of metal nitride) and a metal layer (e.g., of tungsten). The common source line CSL may be a line-shaped structure extending along the trench 210.

Thereafter, an upper interlayered insulating layer 235 may be formed on the substrate 100.

Referring to FIG. 5Q, bit line plugs 240 and bit lines BL may be formed on the cell array region CAR, and interconnection plugs 245 and metal lines 260 may be formed on the word line contact region WCTR and the peripheral circuit region PERI.

The bit line plugs 240 may be connected to the contact pads 240, respectively. Accordingly, the bit line plugs 240 may be electrically connected to the vertical channel structures 200a, respectively. The interconnection plugs 245 may be connected to the gate electrodes 220, respectively, or to the horizontal gate electrode 112 and the source/drain regions 113 of the horizontal transistor 110. The bit lines BL may be formed on the bit line plugs 240 to cross the gate electrodes 220. The metal lines 260 may be formed on the interconnection plugs 245.

The formation of the bit line plugs 240 may include forming contact holes to penetrate the upper interlayered insulating layer 235 and then filling the contact holes with at least one conductive material. The interconnection plugs 245 may be formed concurrently with the formation of the bit line plugs 240. The formation of the interconnection plugs 245 may include forming contact holes to penetrate the upper interlayered insulating layer 235, the upper insulating layer 175, and/or the peripheral insulating layer 120 and then filling the contact holes with at least one conductive material.

The bit line plugs 240 and the interconnection plugs 245 may be formed of at least one of metallic materials. For example, the bit line plugs 240 and the interconnection plugs 245 may include a barrier metal layer (e.g., of metal nitride) and a metal layer (e.g., of tungsten).

In example embodiments, the formation of the bit lines BL and the metal lines 260 may include sequentially forming a barrier metal layer (e.g., of metal nitride) and a metal layer (e.g., of tungsten).

FIGS. 6A through 6E are sectional views taken along lines I-I' and II-II' of FIG. 3B to illustrate a method of fabricating a semiconductor device 10b according to other example embodiments of the inventive concept.

Figure 6A:
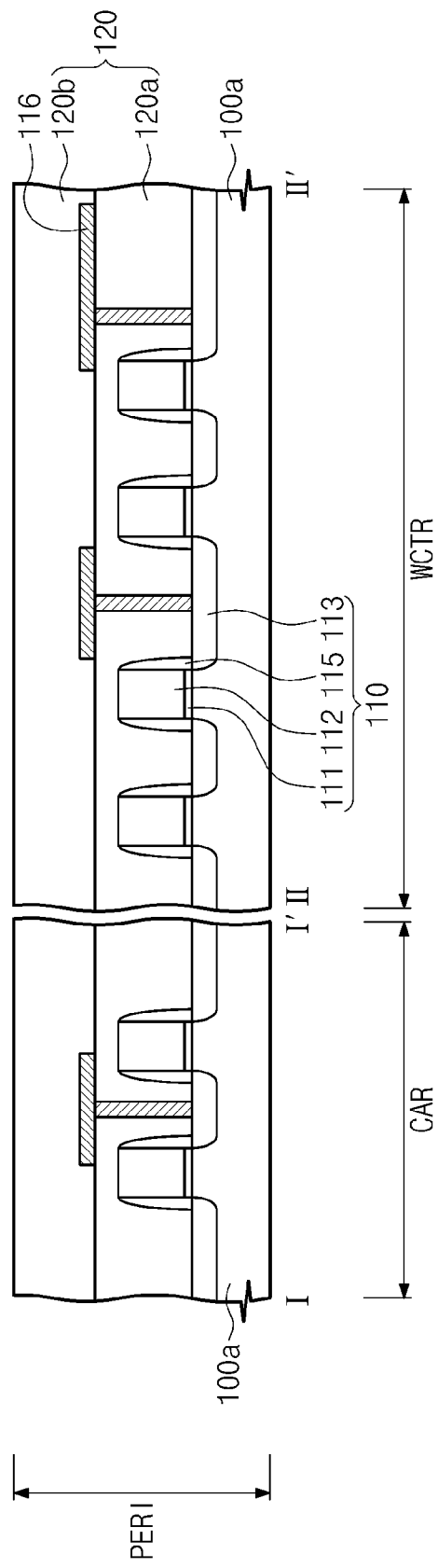

Referring to FIG. 6A, a plurality of horizontal transistors 110 and a plurality of peripheral metal lines 116 may be formed on a first substrate 100a. The peripheral metal lines 116 may be formed to connect the plurality of horizontal transistors 110 to each other.

The first substrate 100a may be formed of or include a material exhibiting a semiconductor property. For example, the substrate 100 may be provided in the form of a silicon wafer. The first substrate 100a may include a peripheral circuit region PERI.

Each of the horizontal transistors 110 may be formed to include a horizontal gate insulating pattern 111, a horizontal gate electrode 112, source/drain regions 113, and gate spacers 115.

The horizontal transistors 110 and the metal lines 116 may be covered with a peripheral insulating layer 120. The peripheral insulating layer 120 may include a first peripheral insulating layer 120a and a second peripheral insulating layer 120b. Each of the first and second peripheral insulating layers 120a and 120b may include a silicon oxide layer.

Figure 6B:
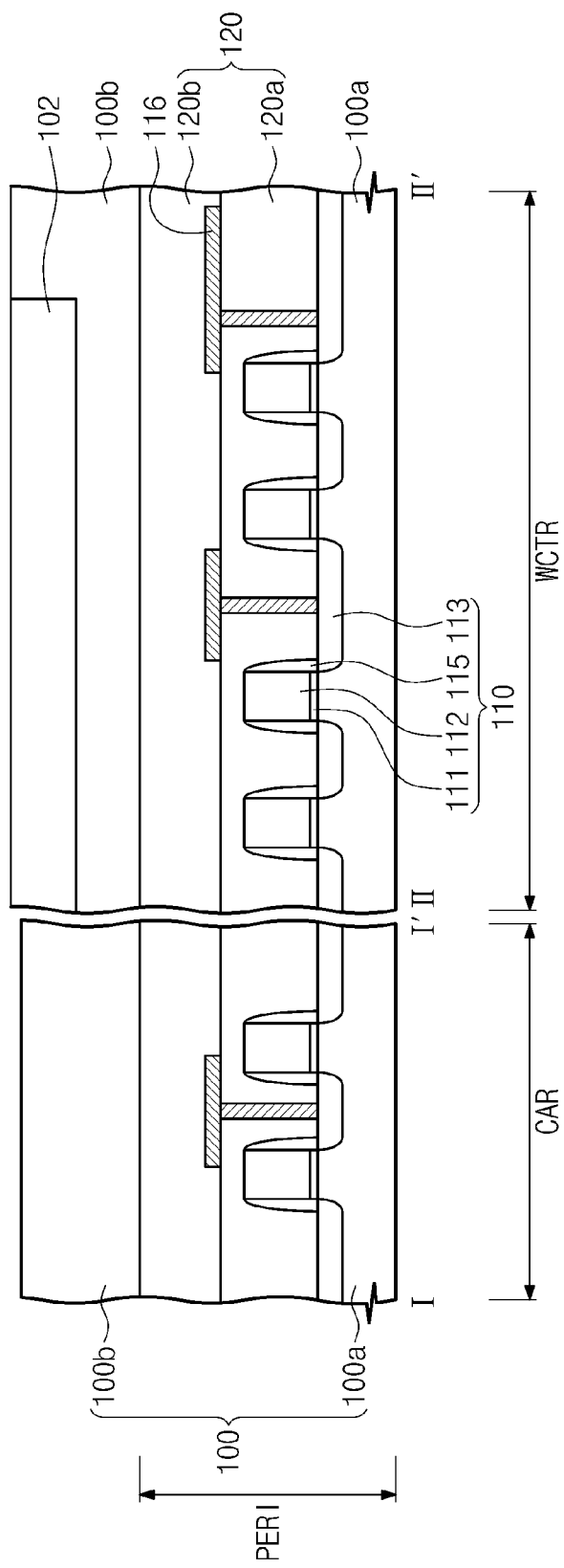

Referring to FIG. 6B, a second substrate 100b may be formed on the second peripheral insulating layer 120b. The second substrate 100b may be formed by depositing a semiconductor layer (e.g., a poly or amorphous silicon layer) and then crystallizing the deposited semiconductor layer. The second substrate 100b may include a cell array region CAR and a word line contact region WCTR. A device isolation layer 102 may be formed on the second substrate 100b. The formation of the device isolation layer 102 may include performing a shallow-trench isolation (STI) process. The STI process may include patterning the second substrate 100b to form isolation trenches and filling the isolation trenches with an insulating material (e.g., silicon oxide).

Figure 6C:
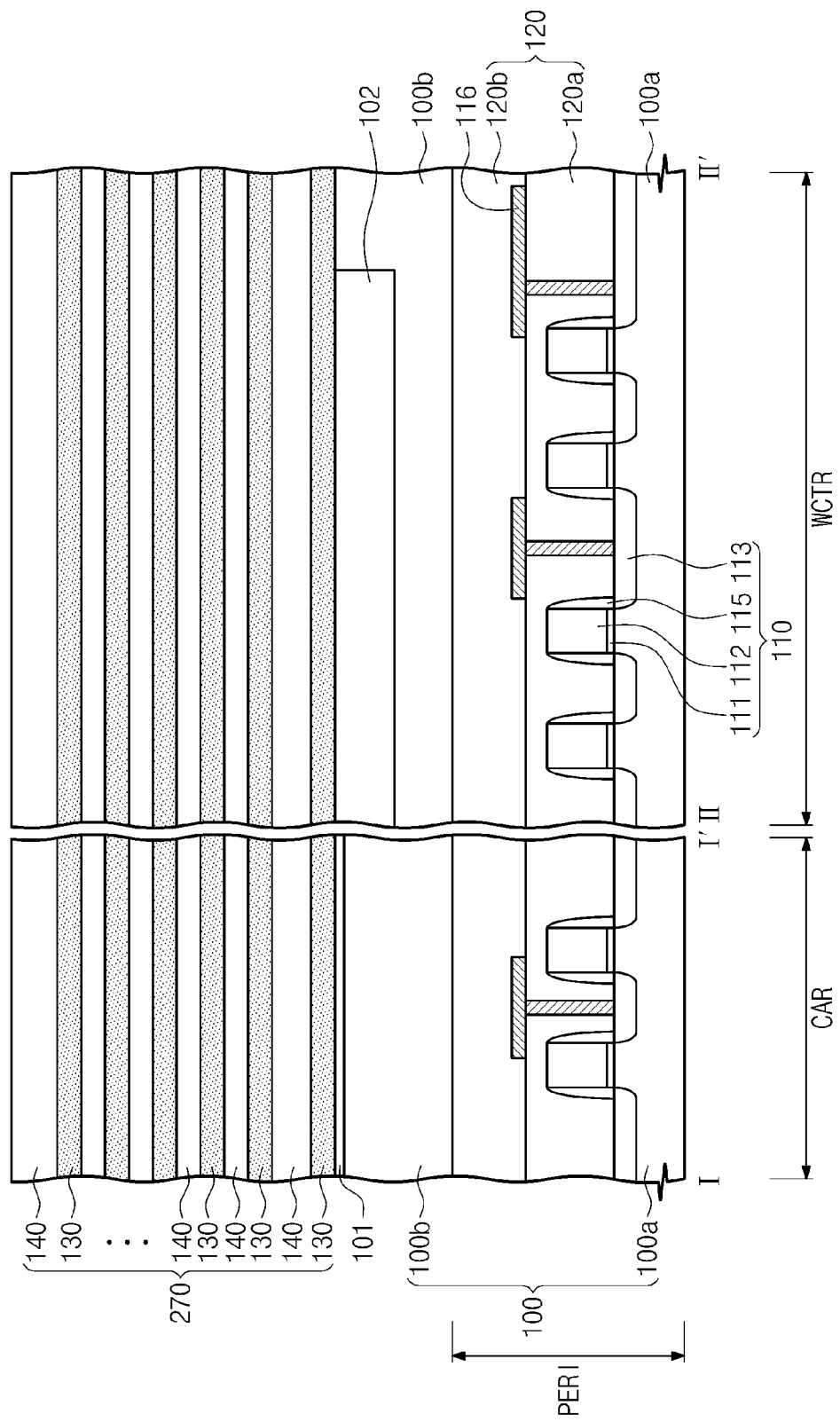

Referring to FIG. 6C, interlayered insulating layers 140 and sacrificial layers 130 may be alternatingly and repeatedly formed to form a layered structure 270 on the second substrate 100b. In certain embodiments, before the formation of the layered structure 270, a lower gate insulating layer 101 may be formed on a top surface of the second substrate 100b. The lower gate insulating layer 101 may be formed by performing a thermal oxidation layer on the top surface of the second substrate 100b.

Figure 6D:
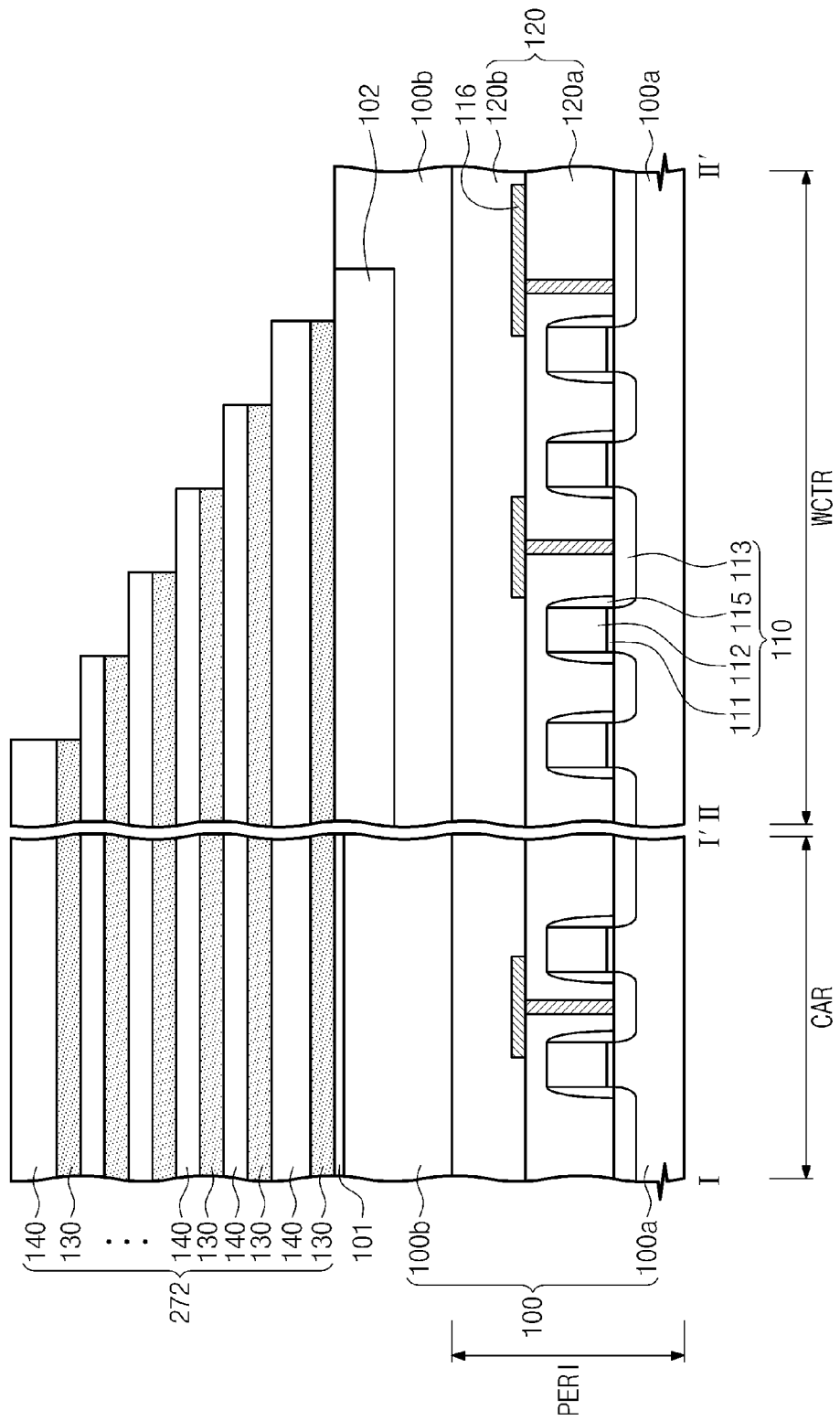

Referring to FIG. 6D, the layered structure 270 may be patterned to form a cell structure 272 on the cell array region CAR of the second substrate 100b. The cell structure 272 may be formed by patterning the layered structure 270 several times, and thus, the cell structure 272 may have a staircase structure on the word line contact region WCTR. For example, the cell structure 272 may extend from the cell array region CAR to the word line contact region WCTR and have a staircase contact portion on the word line contact region WCTR. Since the cell structure 272 is formed to have the staircase structure, end portions of the interlayered insulating layers 140 and the sacrificial layers 130 may be formed on the word line contact region WCTR.

Referring to FIG. 6E, an upper insulating layer 175 may be formed on the word line contact region WCTR of the second substrate 100b.

The subsequent steps of the fabricating process may be performed in the same or similar manner as those of the previous embodiments described with reference to FIGS. 5K through 5Q, and thus, for concise description, a detailed description thereof will be omitted.

According to the afore-described method for fabricating a three-dimensional semiconductor device, the semiconductor patterns 190 may be formed in the channel holes 200a but not in the dummy holes 200b. This makes it possible to reduce dispersion in the selective epitaxial growth (SEG) process for forming the semiconductor patterns 190. As a result, it is possible to improve uniformity of the semiconductor patterns 190, which are formed on the cell array region CAR, and thereby to realize a three-dimensional semiconductor device with improved electric characteristics.

Figure 7:
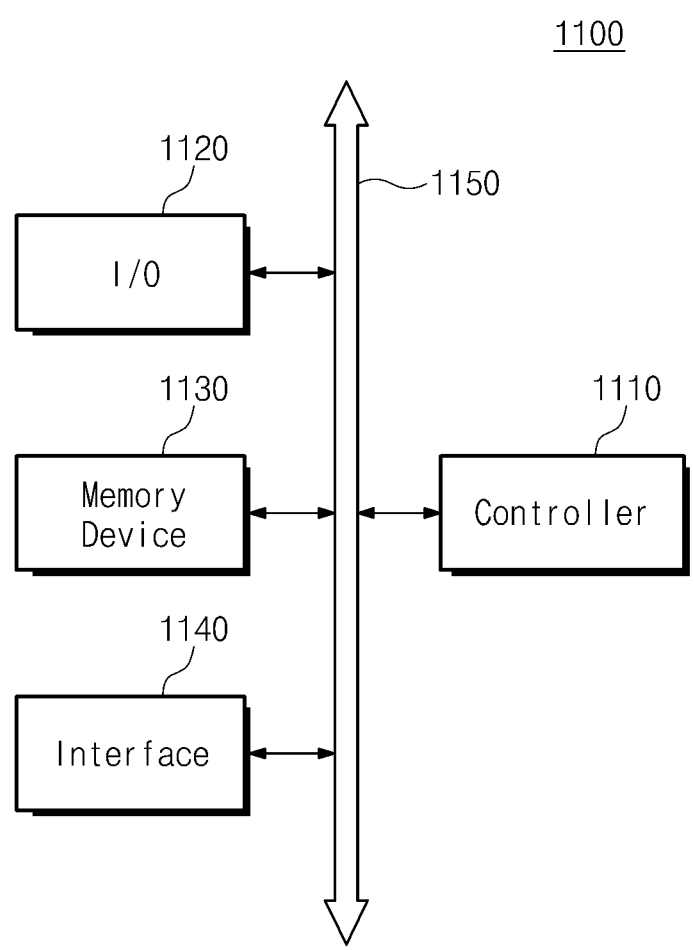
FIG. 7 is a schematic block diagram illustrating an example of electronic systems including a three-dimensional semiconductor device according to example embodiments of the inventive concept.

FIG. 7 is a schematic block diagram illustrating an example of electronic systems including a three-dimensional semiconductor device according to example embodiments of the inventive concept. Referring to FIG. 7, an electronic system 1100 according to example embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other via the data bus 1150. The data bus 1150 may correspond to a path through which electrical signals are transmitted.

The controller 1110 may include at least one of a microprocessor, a digital signal processor, a microcontroller, or other logic devices. The other logic devices may have a similar function to any one of the microprocessor, the digital signal processor and the microcontroller. The I/O unit 1120 may include a keypad, a keyboard or a display unit. The memory device 1130 may store data and/or commands. In example embodiments, the memory device 1130 may include at least one of the afore-described three-dimensional semiconductor devices. In certain embodiments, the memory device 1130 may further include at least one of phase-changeable memory devices, magnetic memory devices, DRAM devices, and SRAM devices. The interface unit 1140 may transmit electrical data to a communication network or may receive electrical data from a communication network. The interface unit 1140 may operate by wireless or cable. For example, the interface unit 1140 may include an antenna or a wireless or wired transceiver. Although not illustrated, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit information data wirelessly.

Figure 8:
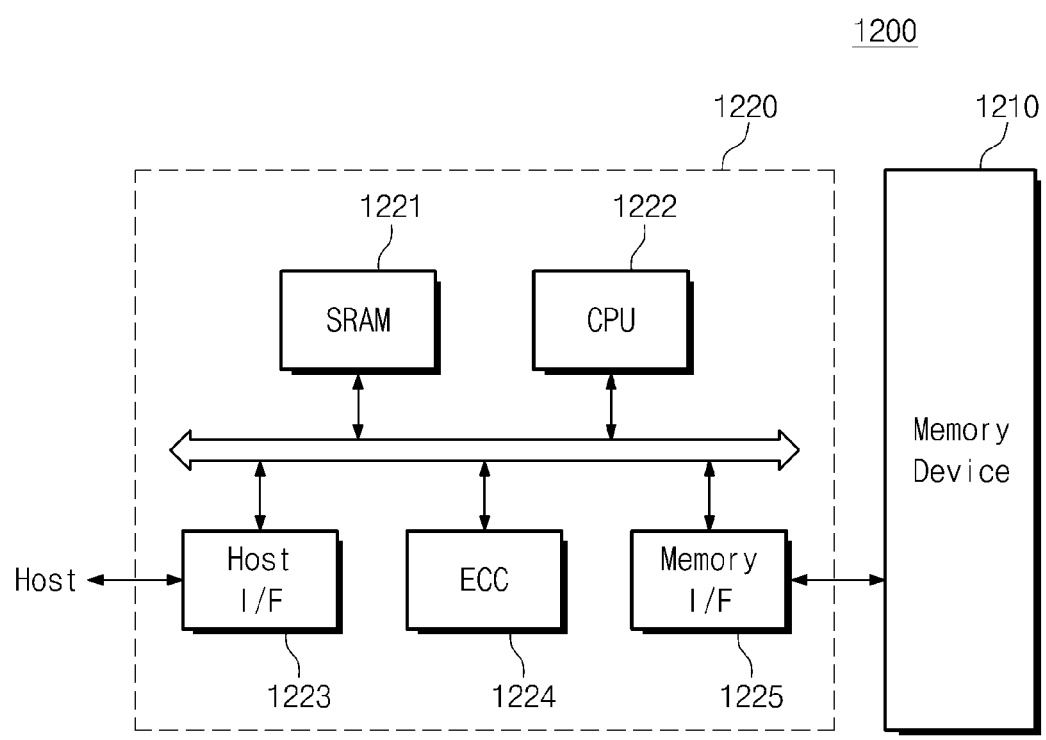
FIG. 8 is a schematic block diagram illustrating an example of memory systems including a three-dimensional semiconductor device according to example embodiments of the inventive concept.

FIG. 8 is a schematic block diagram illustrating an example of memory systems including a three-dimensional semiconductor device according to example embodiments of the inventive concept.

Referring to FIG. 8, a memory system 1200 according to example embodiments of the inventive concepts may include a memory device 1210. The memory device 1210 may include at least one of the afore-described three-dimensional semiconductor devices. The memory device 1210 may further include at least one of phase-changeable memory devices, magnetic memory devices, DRAM devices, and SRAM devices. The memory system 1200 may include a memory controller 1220 that controls data communication between a host and the memory device 1210.

The memory controller 1220 may include a processing unit 1222 that controls overall operations of the memory system 1200. The memory controller 1220 may include an SRAM device 1221 used as an operation memory of the processing unit 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory system 1200 may further include a read only memory (ROM) device that stores code data to interface with the host. The memory system 1200 may be used as a portable data storage card. Alternatively, the memory system 1200 may be provided in the form of solid state disks (SSD), instead of hard disks of computer systems.

According to example embodiments of the inventive concept, gate electrodes are vertically stacked on a substrate with a cell array region and a word line contact region, and channel holes and dummy holes are provided to penetrate the gate electrodes on the cell array region and the word line contact region, respectively. Thereafter, semiconductor patterns may be formed in the channel holes, but not in the dummy holes. Accordingly, it is possible to reduce dispersion in a selective epitaxial growth (SEG) process for forming the semiconductor patterns. As a result, it is possible to improve uniformity of the semiconductor patterns, which are formed on the cell array region, and thereby to realize a three-dimensional semiconductor device with improved electric characteristics.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor device, comprising:
a substrate including a cell array region, a word line contact region, and a peripheral circuit region;
gate electrodes stacked on the substrate to extend from the cell array region to the word line contact region;
a vertical channel structure penetrating the gate electrodes on the cell array region and being electrically connected to the substrate;
a semiconductor pattern disposed between the vertical channel structure and the substrate; and
a dummy pillar penetrating the gate electrodes on the word line contact region and being electrically separated from the substrate, the dummy pillar penetrating a lowermost one of the gate electrodes,
wherein the semiconductor pattern penetrates the lowermost one of the gate electrodes and is in contact with the substrate.

2. The device of claim 1, wherein the substrate comprises a first substrate and a second substrate, and the first substrate is disposed below the second substrate.

3. The device of claim 2, wherein the first substrate comprises the peripheral circuit region, and the second substrate comprises the cell array region and the word line contact region.

4. The device of claim 1, wherein the peripheral circuit region comprises a horizontal transistor.

5. The device of claim 1, wherein horizontal lengths of the gate electrodes decrease with increasing distance from the substrate.

6. The device of claim 1, wherein the vertical channel structure comprises a gate dielectric pattern, a vertical channel pattern, and an insulating gap-fill pattern.

7. The device of claim 6, wherein the gate dielectric pattern has a pipe-shaped structure.

8. The device of claim 6, wherein the gate dielectric pattern comprises a charge blocking layer, a charge storing layer, and a tunnel insulating layer.

9. The device of claim 6, wherein the vertical channel pattern has a hollow cylindrical shape or a cup shape.

10. The device of claim 6, wherein the vertical channel pattern is in direct contact with the semiconductor pattern.

11. The device of claim 1, wherein the dummy pillar is in contact with a device isolation layer, which is on the word line contact region.

12. The device of claim 1, wherein the dummy pillar comprises a gate dielectric pattern, a vertical channel pattern, and an insulating gap-fill pattern.

13. The device of claim 1, wherein the vertical channel structure has a bottom surface positioned at a higher level than a bottom surface of the dummy pillar.

14. The device of claim 1, further comprising:
interconnection plugs electrically connected to the gate electrodes.

15. The device of claim 14, wherein the interconnection plugs have different vertical lengths from each other.

16. A three-dimensional semiconductor device, comprising:
a substrate including a cell array region, a word line contact region, and a peripheral circuit region;
gate electrodes stacked on the substrate to extend from the cell array region to the word line contact region;
the gate electrodes including a channel hole, the channel hole penetrating the gate electrodes on the cell array region and exposing an active region of the substrate;
the gate electrodes including a dummy hole, the dummy hole penetrating the gate electrodes on the word line contact region and exposing a device isolation layer on the substrate, the dummy hole penetrating a lowermost one of the gate electrodes; and
a semiconductor pattern in the channel hole but not in the dummy hole,
wherein the semiconductor pattern penetrates the lowermost one of the gate electrodes and is in contact with the substrate.

17. The device of claim 16, wherein the substrate comprises a first substrate and a second substrate, and the first substrate is provided below the second substrate.

18. The device of claim 17, wherein the first substrate comprises the peripheral circuit region, and the second substrate comprises the cell array region and the word line contact region.

19. A three-dimensional semiconductor device, comprising:
a substrate including a cell array region and a word line contact region;
gate electrodes stacked on the substrate to extend from the cell array region to the word line contact region;
the gate electrodes including a channel hole, the channel hole penetrating the gate electrodes on the cell array region and exposing an active region of the substrate;
the gate electrodes including a dummy hole, the dummy hole penetrating the gate electrodes on the word line contact region and exposing a device isolation layer on the substrate;
a semiconductor pattern and a vertical channel structure in the channel hole; and
a dummy pillar in the dummy hole, the dummy pillar having a bottom surface positioned at a lower level than a bottom surface of the vertical channel structure, the dummy pillar penetrating a lowermost one of the gate electrodes,
wherein the semiconductor pattern penetrates the lowermost one of the gate electrodes and is in contact with the substrate.

* * * * *